US008596813B2

(12) United States Patent
Ivey

(10) Patent No.: US 8,596,813 B2
(45) Date of Patent: Dec. 3, 2013

(54) CIRCUIT BOARD MOUNT FOR LED LIGHT TUBE

(75) Inventor: John Ivey, Farmington Hills, MI (US)

(73) Assignee: iLumisys, Inc., Troy, MI (US)

( * ) Notice: Subject to any disclaimer, the term of this patent is extended or adjusted under 35 U.S.C. 154(b) by 199 days.

(21) Appl. No.: 13/179,790

(22) Filed: Jul. 11, 2011

(65) Prior Publication Data

US 2012/0008316 A1 Jan. 12, 2012

Related U.S. Application Data

(60) Provisional application No. 61/363,405, filed on Jul. 12, 2010.

(51) Int. Cl.
*F21V 21/00* (2006.01)
*H05K 5/00* (2006.01)

(52) U.S. Cl.
USPC ................. 362/217.13; 362/217.12; 362/219; 362/249.02; 362/368; 362/800; 361/751; 361/752

(58) Field of Classification Search
None
See application file for complete search history.

(56) References Cited

U.S. PATENT DOCUMENTS

| | | | |
|---|---|---|---|
| D54,511 | S | 2/1920 | Owen |
| D58,105 | S | 6/1921 | Poritz |
| D79,814 | S | 8/1929 | Hoch |
| D80,419 | S | 1/1930 | Kramer |
| D84,763 | S | 7/1931 | Stange |
| D119,797 | S | 4/1940 | Winkler et al. |
| D125,312 | S | 2/1941 | Logan |
| 2,909,097 | A | 10/1959 | Alden et al. |
| 3,318,185 | A | 5/1967 | Kott |
| 3,561,719 | A | 2/1971 | Grindle |
| 3,586,936 | A | 6/1971 | McLeroy |
| 3,601,621 | A | 8/1971 | Ritchie |
| 3,612,855 | A | 10/1971 | Juhnke |
| 3,643,088 | A | 2/1972 | Osteen et al. |
| 3,746,918 | A | 7/1973 | Drucker et al. |
| 3,818,216 | A | 6/1974 | Larraburu |

(Continued)

FOREIGN PATENT DOCUMENTS

| | | | |
|---|---|---|---|
| CN | 1584388 | A | 2/2005 |
| CN | 2766345 | Y | 3/2006 |

(Continued)

OTHER PUBLICATIONS

International Search Report and Written Opinion dated Feb. 6, 2012 from the corresponding International Application No. PCT/US2011/043524 filed Jul. 11, 2011.

(Continued)

*Primary Examiner* — Ashok Patel
(74) *Attorney, Agent, or Firm* — Young Basile

(57) ABSTRACT

Disclosed herein are embodiments of LED-based lights for replacing a conventional fluorescent light bulb in a fluorescent light fixture and embodiments of a circuit board mount for an LED-based light tube having an elongate housing with at least one circuit board spanning the housing. One embodiment disclosed herein of a circuit board mount comprises an end cap configured to fit over an open end of the housing. The end cap comprises an end wall, at least one pin connector extending through the end wall and at least one fitted slot extending from the end wall configured to receive an end of the circuit board, the at least one fitted slot having an elastic member within the at least one fitted slot configured to cushion the circuit board.

17 Claims, 2 Drawing Sheets

(56) References Cited

U.S. PATENT DOCUMENTS

| | | | |
|---|---|---|---|
| 3,832,503 | A | 8/1974 | Crane |
| 3,858,086 | A | 12/1974 | Anderson et al. |
| 3,909,670 | A | 9/1975 | Wakamatsu et al. |
| 3,924,120 | A | 12/1975 | Cox, III |
| 3,958,885 | A | 5/1976 | Stockinger et al. |
| 3,974,637 | A | 8/1976 | Bergey et al. |
| 3,993,386 | A | 11/1976 | Rowe |
| 4,001,571 | A | 1/1977 | Martin |
| 4,054,814 | A | 10/1977 | Fegley et al. |
| 4,070,568 | A | 1/1978 | Gala |
| 4,082,395 | A | 4/1978 | Donato et al. |
| 4,096,349 | A | 6/1978 | Donato |
| 4,102,558 | A | 7/1978 | Krachman |
| 4,107,581 | A | 8/1978 | Abernethy |
| 4,189,663 | A | 2/1980 | Schmutzer et al. |
| 4,211,955 | A | 7/1980 | Ray |
| 4,241,295 | A | 12/1980 | Williams, Jr. |
| 4,271,408 | A | 6/1981 | Teshima et al. |
| 4,272,689 | A | 6/1981 | Crosby et al. |
| 4,273,999 | A | 6/1981 | Pierpoint |
| 4,298,869 | A | 11/1981 | Okuno |
| 4,329,625 | A | 5/1982 | Nishizawa et al. |
| 4,339,788 | A | 7/1982 | White et al. |
| 4,342,947 | A | 8/1982 | Bloyd |
| 4,367,464 | A | 1/1983 | Kurahashi et al. |
| D268,134 | S | 3/1983 | Zurcher |
| 4,382,272 | A | 5/1983 | Quella et al. |
| 4,388,567 | A | 6/1983 | Yamazaki et al. |
| 4,388,589 | A | 6/1983 | Molldrem, Jr. |
| 4,392,187 | A | 7/1983 | Bornhorst |
| 4,394,719 | A | 7/1983 | Moberg |
| 4,420,711 | A | 12/1983 | Takahashi et al. |
| 4,455,562 | A | 6/1984 | Dolan et al. |
| 4,500,796 | A | 2/1985 | Quin |
| 4,521,835 | A | 6/1985 | Meggs et al. |
| 4,581,687 | A | 4/1986 | Nakanishi |
| 4,597,033 | A | 6/1986 | Meggs et al. |
| 4,600,972 | A | 7/1986 | MacIntyre |
| 4,607,317 | A | 8/1986 | Lin |
| 4,622,881 | A | 11/1986 | Rand |
| 4,625,152 | A | 11/1986 | Nakai |
| 4,635,052 | A | 1/1987 | Aoike et al. |
| 4,647,217 | A | 3/1987 | Havel |
| 4,656,398 | A | 4/1987 | Michael et al. |
| 4,661,890 | A | 4/1987 | Watanabe et al. |
| 4,668,895 | A | 5/1987 | Schneiter |
| 4,675,575 | A | 6/1987 | Smith et al. |
| 4,682,079 | A | 7/1987 | Sanders et al. |
| 4,686,425 | A | 8/1987 | Havel |
| 4,687,340 | A | 8/1987 | Havel |
| 4,688,154 | A | 8/1987 | Nilssen |
| 4,688,869 | A | 8/1987 | Kelly |
| 4,695,769 | A | 9/1987 | Schweickardt |
| 4,698,730 | A | 10/1987 | Sakai et al. |
| 4,701,669 | A | 10/1987 | Head et al. |
| 4,705,406 | A | 11/1987 | Havel |
| 4,707,141 | A | 11/1987 | Havel |
| D293,723 | S | 1/1988 | Buttner |
| 4,727,289 | A | 2/1988 | Uchida |
| 4,740,882 | A | 4/1988 | Miller |
| 4,748,545 | A | 5/1988 | Schmitt |
| 4,753,148 | A | 6/1988 | Johnson |
| 4,758,173 | A | 7/1988 | Northrop |
| 4,765,708 | A | 8/1988 | Becker et al. |
| 4,771,274 | A | 9/1988 | Havel |
| 4,780,621 | A | 10/1988 | Bartleucci et al. |
| 4,794,383 | A | 12/1988 | Havel |
| 4,810,937 | A | 3/1989 | Havel |
| 4,818,072 | A | 4/1989 | Mohebban |
| 4,824,269 | A | 4/1989 | Havel |
| 4,837,565 | A | 6/1989 | White |
| 4,843,627 | A | 6/1989 | Stebbins |
| 4,845,481 | A | 7/1989 | Havel |
| 4,845,745 | A | 7/1989 | Havel |
| 4,854,701 | A | 8/1989 | Noll et al. |
| 4,857,801 | A | 8/1989 | Farrell |
| 4,863,223 | A | 9/1989 | Weissenbach et al. |
| 4,870,325 | A | 9/1989 | Kazar |
| 4,874,320 | A | 10/1989 | Freed et al. |
| 4,887,074 | A | 12/1989 | Simon et al. |
| 4,894,832 | A | 1/1990 | Colak |
| 4,901,207 | A | 2/1990 | Sato et al. |
| 4,912,371 | A | 3/1990 | Hamilton |
| 4,922,154 | A | 5/1990 | Cacoub |
| 4,929,936 | A | 5/1990 | Friedman et al. |
| 4,934,852 | A | 6/1990 | Havel |
| 4,941,072 | A | 7/1990 | Yasumoto et al. |
| 4,943,900 | A | 7/1990 | Gartner |
| 4,962,687 | A | 10/1990 | Belliveau et al. |
| 4,965,561 | A | 10/1990 | Havel |
| 4,973,835 | A | 11/1990 | Kurosu et al. |
| 4,977,351 | A | 12/1990 | Bavaro et al. |
| 4,979,081 | A | 12/1990 | Leach et al. |
| 4,980,806 | A | 12/1990 | Taylor et al. |
| 4,992,704 | A | 2/1991 | Stinson |
| 5,003,227 | A | 3/1991 | Nilssen |
| 5,008,595 | A | 4/1991 | Kazar |
| 5,008,788 | A | 4/1991 | Palinkas |
| 5,010,459 | A | 4/1991 | Taylor et al. |
| 5,018,054 | A | 5/1991 | Ohashi et al. |
| 5,027,037 | A | 6/1991 | Wei |
| 5,027,262 | A | 6/1991 | Freed |
| 5,032,960 | A | 7/1991 | Katoh |
| 5,034,807 | A | 7/1991 | Von Kohorn |
| 5,036,248 | A | 7/1991 | McEwan et al. |
| 5,038,255 | A | 8/1991 | Nishihashi et al. |
| 5,065,226 | A | 11/1991 | Kluitmans et al. |
| 5,072,216 | A | 12/1991 | Grange |
| 5,078,039 | A | 1/1992 | Tulk et al. |
| 5,083,063 | A | 1/1992 | Brooks |
| 5,088,013 | A | 2/1992 | Revis |
| 5,089,748 | A | 2/1992 | Ihms |
| 5,103,382 | A | 4/1992 | Kondo et al. |
| 5,122,733 | A | 6/1992 | Havel |
| 5,126,634 | A | 6/1992 | Johnson |
| 5,128,595 | A | 7/1992 | Hara |
| 5,130,909 | A | 7/1992 | Gross |
| 5,134,387 | A | 7/1992 | Smith et al. |
| 5,140,220 | A | 8/1992 | Hasegawa |
| 5,142,199 | A | 8/1992 | Elwell |
| 5,151,679 | A | 9/1992 | Dimmick |
| 5,154,641 | A | 10/1992 | McLaughlin |
| 5,161,879 | A | 11/1992 | McDermott |
| 5,161,882 | A | 11/1992 | Garrett |
| 5,164,715 | A | 11/1992 | Kashiwabara et al. |
| 5,184,114 | A | 2/1993 | Brown |
| 5,194,854 | A | 3/1993 | Havel |
| 5,198,756 | A | 3/1993 | Jenkins et al. |
| 5,209,560 | A | 5/1993 | Taylor et al. |
| 5,220,250 | A | 6/1993 | Szuba |
| 5,225,765 | A | 7/1993 | Callahan et al. |
| 5,226,723 | A | 7/1993 | Chen |
| 5,254,910 | A | 10/1993 | Yang |
| 5,256,948 | A | 10/1993 | Boldin et al. |
| 5,278,542 | A | 1/1994 | Smith et al. |
| 5,282,121 | A | 1/1994 | Bornhorst et al. |
| 5,283,517 | A | 2/1994 | Havel |
| 5,287,352 | A | 2/1994 | Jackson et al. |
| 5,294,865 | A | 3/1994 | Haraden |
| 5,298,871 | A | 3/1994 | Shimohara |
| 5,301,090 | A | 4/1994 | Hed |
| 5,303,124 | A | 4/1994 | Wrobel |
| 5,307,295 | A | 4/1994 | Taylor et al. |
| 5,321,593 | A | 6/1994 | Moates |
| 5,323,226 | A | 6/1994 | Schreder |
| 5,329,431 | A | 7/1994 | Taylor et al. |
| 5,344,068 | A | 9/1994 | Haessig |
| 5,350,977 | A | 9/1994 | Hamamoto et al. |
| 5,357,170 | A | 10/1994 | Luchaco et al. |
| 5,371,618 | A | 12/1994 | Tai et al. |
| 5,374,876 | A | 12/1994 | Horibata et al. |
| 5,375,043 | A | 12/1994 | Tokunaga |
| D354,360 | S | 1/1995 | Murata |
| 5,381,074 | A | 1/1995 | Rudzewicz et al. |

(56) References Cited

U.S. PATENT DOCUMENTS 5,388,357 A 2/1995 Malita
5,402,702 A 4/1995 Hata
5,404,282 A 4/1995 Klinke et al.
5,406,176 A 4/1995 Sugden
5,410,328 A 4/1995 Yoksza et al.
5,412,284 A 5/1995 Moore et al.
5,412,552 A 5/1995 Fernandes
5,420,482 A 5/1995 Phares
5,421,059 A 6/1995 Leffers, Jr.
5,430,356 A 7/1995 Ference et al.
5,432,408 A 7/1995 Matsuda et al.
5,436,535 A 7/1995 Yang
5,436,853 A 7/1995 Shimohara
5,450,301 A 9/1995 Waltz et al.
5,461,188 A 10/1995 Drago et al.
5,463,280 A 10/1995 Johnson
5,463,502 A 10/1995 Savage, Jr.
5,465,144 A 11/1995 Parker et al.
5,473,522 A 12/1995 Kriz et al.
5,475,300 A 12/1995 Havel
5,489,827 A 2/1996 Xia
5,491,402 A 2/1996 Small
5,493,183 A 2/1996 Kimball
5,504,395 A 4/1996 Johnson et al.
5,506,760 A 4/1996 Giebler et al.
5,513,082 A 4/1996 Asano
5,519,496 A 5/1996 Borgert et al.
5,530,322 A 6/1996 Ference et al.
5,544,809 A 8/1996 Keating et al.
5,545,950 A 8/1996 Cho
5,550,440 A 8/1996 Allison et al.
5,559,681 A 9/1996 Duarte
5,561,346 A 10/1996 Byrne
D376,030 S 11/1996 Cohen
5,575,459 A 11/1996 Anderson
5,575,554 A 11/1996 Guritz
5,581,158 A 12/1996 Quazi
5,592,051 A 1/1997 Korkala
5,592,054 A 1/1997 Nerone et al.
5,600,199 A 2/1997 Martin, Sr. et al.
5,607,227 A 3/1997 Yasumoto et al.
5,608,290 A 3/1997 Hutchisson et al.
5,614,788 A 3/1997 Mullins et al.
5,621,282 A 4/1997 Haskell
5,621,603 A 4/1997 Adamec et al.
5,621,662 A 4/1997 Humphries et al.
5,622,423 A 4/1997 Lee
5,633,629 A 5/1997 Hochstein
5,634,711 A 6/1997 Kennedy et al.
5,640,061 A 6/1997 Bornhorst et al.
5,640,141 A 6/1997 Myllymaki
5,642,129 A 6/1997 Zavracky et al.
5,655,830 A 8/1997 Ruskouski
5,656,935 A 8/1997 Havel
5,661,374 A 8/1997 Cassidy et al.
5,661,645 A 8/1997 Hochstein
5,673,059 A 9/1997 Zavracky et al.
5,682,103 A 10/1997 Burrell
5,688,042 A 11/1997 Madadi et al.
5,697,695 A 12/1997 Lin et al.
5,701,058 A 12/1997 Roth
5,712,650 A 1/1998 Barlow
5,721,471 A 2/1998 Begemann et al.
5,725,148 A 3/1998 Hartman
5,726,535 A 3/1998 Yan
5,731,759 A 3/1998 Finucan
5,734,590 A 3/1998 Tebbe
5,751,118 A 5/1998 Mortimer
5,752,766 A 5/1998 Bailey et al.
5,765,940 A 6/1998 Levy et al.
5,769,527 A 6/1998 Taylor et al.
5,784,006 A 7/1998 Hochstein
5,785,227 A 7/1998 Akiba
5,790,329 A 8/1998 Klaus et al.
5,803,579 A 9/1998 Turnbull et al.
5,803,580 A 9/1998 Tseng
5,803,729 A 9/1998 Tsimerman
5,806,965 A 9/1998 Deese
5,808,689 A 9/1998 Small
5,810,463 A 9/1998 Kawahara et al.
5,812,105 A 9/1998 Van de Ven
5,813,751 A 9/1998 Shaffer
5,813,753 A 9/1998 Vriens et al.
5,821,695 A 10/1998 Vilanilam et al.
5,825,051 A 10/1998 Bauer et al.
5,828,178 A 10/1998 York et al.
5,836,676 A 11/1998 Ando et al.
5,848,837 A 12/1998 Gustafson
5,850,126 A 12/1998 Kanbar
5,851,063 A 12/1998 Doughty et al.
5,852,658 A 12/1998 Knight et al.
5,854,542 A 12/1998 Forbes
RE36,030 E 1/1999 Nadeau
5,859,508 A 1/1999 Ge et al.
5,865,529 A 2/1999 Yan
5,890,794 A 4/1999 Abtahi et al.
5,896,010 A 4/1999 Mikolajczak et al.
5,907,742 A 5/1999 Johnson et al.
5,912,653 A 6/1999 Fitch
5,921,660 A 7/1999 Yu
5,924,784 A 7/1999 Chliwnyj et al.
5,927,845 A 7/1999 Gustafson et al.
5,934,792 A 8/1999 Camarota
5,943,802 A 8/1999 Tijanic
5,946,209 A 8/1999 Eckel et al.
5,949,347 A 9/1999 Wu
5,952,680 A 9/1999 Strite
5,959,547 A 9/1999 Tubel et al.
5,962,989 A 10/1999 Baker
5,962,992 A 10/1999 Huang et al.
5,963,185 A 10/1999 Havel
5,974,553 A 10/1999 Gandar
5,980,064 A 11/1999 Metroyanis
5,998,925 A 12/1999 Shimizu et al.
5,998,928 A 12/1999 Hipp
6,007,209 A 12/1999 Pelka
6,008,783 A 12/1999 Kitagawa et al.
6,011,691 A 1/2000 Schreffler
6,016,038 A 1/2000 Mueller et al.
6,018,237 A 1/2000 Havel
6,019,493 A 2/2000 Kuo et al.
6,020,825 A 2/2000 Chansky et al.
6,025,550 A 2/2000 Kato
6,028,694 A 2/2000 Schmidt
6,030,099 A 2/2000 McDermott
6,031,343 A 2/2000 Recknagel et al.
D422,737 S 4/2000 Orozco
6,056,420 A 5/2000 Wilson et al.
6,068,383 A 5/2000 Robertson et al.
6,069,597 A 5/2000 Hansen
6,072,280 A 6/2000 Allen
6,084,359 A 7/2000 Hetzel et al.
6,086,220 A 7/2000 Lash et al.
6,091,200 A 7/2000 Lenz
6,092,915 A 7/2000 Rensch
6,095,661 A 8/2000 Lebens et al.
6,097,352 A 8/2000 Zavracky et al.
6,116,748 A 9/2000 George
6,121,875 A 9/2000 Hamm et al.
6,127,783 A 10/2000 Pashley et al.
6,132,072 A 10/2000 Turnbull et al.
6,135,604 A 10/2000 Lin
6,139,174 A 10/2000 Butterworth
6,149,283 A 11/2000 Conway et al.
6,150,774 A 11/2000 Mueller et al.
6,151,529 A 11/2000 Batko
6,153,985 A 11/2000 Grossman
6,158,882 A 12/2000 Bischoff, Jr.
6,166,496 A 12/2000 Lys et al.
6,175,201 B1 1/2001 Sid
6,175,220 B1 1/2001 Billig et al.
6,181,126 B1 1/2001 Havel
6,183,086 B1 2/2001 Neubert
6,183,104 B1 2/2001 Ferrara

(56) References Cited

U.S. PATENT DOCUMENTS

| | | | |
|---|---|---|---|
| 6,184,628 | B1 | 2/2001 | Ruthenberg |
| 6,196,471 | B1 | 3/2001 | Ruthenberg |
| 6,203,180 | B1 | 3/2001 | Fleischmann |
| 6,211,626 | B1 | 4/2001 | Lys et al. |
| 6,215,409 | B1 | 4/2001 | Blach |
| 6,217,190 | B1 | 4/2001 | Altman et al. |
| 6,219,239 | B1 | 4/2001 | Mellberg et al. |
| 6,227,679 | B1 | 5/2001 | Zhang et al. |
| 6,238,075 | B1 | 5/2001 | Dealey, Jr. et al. |
| 6,241,359 | B1 | 6/2001 | Lin |
| 6,250,774 | B1 | 6/2001 | Begemann et al. |
| 6,252,350 | B1 | 6/2001 | Alvarez |
| 6,252,358 | B1 | 6/2001 | Xydis et al. |
| 6,268,600 | B1 | 7/2001 | Nakamura et al. |
| 6,273,338 | B1 | 8/2001 | White |
| 6,275,397 | B1 | 8/2001 | McClain |
| 6,283,612 | B1 | 9/2001 | Hunter |
| 6,292,901 | B1 | 9/2001 | Lys et al. |
| 6,293,684 | B1 | 9/2001 | Riblett |
| 6,297,724 | B1 | 10/2001 | Bryans et al. |
| 6,305,109 | B1 | 10/2001 | Lee |
| 6,305,821 | B1 | 10/2001 | Hsieh et al. |
| 6,307,331 | B1 | 10/2001 | Bonasia et al. |
| 6,310,590 | B1 | 10/2001 | Havel |
| 6,323,832 | B1 | 11/2001 | Nishizawa et al. |
| 6,325,651 | B1 | 12/2001 | Nishihara et al. |
| 6,334,699 | B1 | 1/2002 | Gladnick |
| 6,340,868 | B1 | 1/2002 | Lys et al. |
| 6,354,714 | B1 | 3/2002 | Rhodes |
| 6,361,186 | B1 | 3/2002 | Slayden |
| 6,362,578 | B1 | 3/2002 | Swanson et al. |
| 6,369,525 | B1 | 4/2002 | Chang et al. |
| 6,371,637 | B1 | 4/2002 | Atchinson et al. |
| 6,379,022 | B1 | 4/2002 | Amerson et al. |
| D457,667 | S | 5/2002 | Piepgras et al. |
| D457,669 | S | 5/2002 | Piepgras et al. |
| D457,974 | S | 5/2002 | Piepgras et al. |
| 6,388,393 | B1 | 5/2002 | Illingworth |
| 6,394,623 | B1 | 5/2002 | Tsui |
| D458,395 | S | 6/2002 | Piepgras et al. |
| 6,400,096 | B1 | 6/2002 | Wells et al. |
| 6,404,131 | B1 | 6/2002 | Kawano et al. |
| 6,411,022 | B1 | 6/2002 | Machida |
| 6,422,716 | B2 | 7/2002 | Henrici et al. |
| 6,428,189 | B1 | 8/2002 | Hochstein |
| D463,610 | S | 9/2002 | Piepgras et al. |
| 6,445,139 | B1 | 9/2002 | Marshall et al. |
| 6,448,550 | B1 | 9/2002 | Nishimura |
| 6,448,716 | B1 | 9/2002 | Hutchison |
| 6,459,919 | B1 | 10/2002 | Lys et al. |
| 6,469,457 | B2 | 10/2002 | Callahan |
| 6,471,388 | B1 | 10/2002 | Marsh |
| 6,472,823 | B2 | 10/2002 | Yen |
| 6,473,002 | B1 | 10/2002 | Hutchison |
| D468,035 | S | 12/2002 | Blanc et al. |
| 6,488,392 | B1 | 12/2002 | Lu |
| 6,495,964 | B1 | 12/2002 | Muthu et al. |
| 6,527,411 | B1 | 3/2003 | Sayers |
| 6,528,954 | B1 | 3/2003 | Lys et al. |
| 6,528,958 | B2 | 3/2003 | Hulshof et al. |
| 6,538,375 | B1 | 3/2003 | Duggal et al. |
| 6,548,967 | B1 | 4/2003 | Dowling et al. |
| 6,568,834 | B1 | 5/2003 | Scianna |
| 6,573,536 | B1 | 6/2003 | Dry |
| 6,577,072 | B2 | 6/2003 | Saito et al. |
| 6,577,080 | B2 | 6/2003 | Lys et al. |
| 6,577,512 | B2 | 6/2003 | Tripathi et al. |
| 6,577,794 | B1 | 6/2003 | Currie et al. |
| 6,578,979 | B2 | 6/2003 | Truttmann-Battig |
| 6,582,103 | B1 | 6/2003 | Popovich et al. |
| 6,583,550 | B2 | 6/2003 | Iwasa et al. |
| 6,583,573 | B2 | 6/2003 | Bierman |
| 6,585,393 | B1 | 7/2003 | Brandes et al. |
| 6,586,890 | B2 | 7/2003 | Min et al. |
| 6,590,343 | B2 | 7/2003 | Pederson |
| 6,592,238 | B2 | 7/2003 | Cleaver et al. |
| 6,596,977 | B2 | 7/2003 | Muthu et al. |
| 6,598,996 | B1 | 7/2003 | Lodhie |
| 6,608,453 | B2 | 8/2003 | Morgan et al. |
| 6,608,614 | B1 | 8/2003 | Johnson |
| 6,609,804 | B2 | 8/2003 | Nolan et al. |
| 6,612,712 | B2 | 9/2003 | Nepil |
| 6,612,717 | B2 | 9/2003 | Yen |
| 6,621,222 | B1 | 9/2003 | Hong |
| 6,623,151 | B2 | 9/2003 | Pederson |
| 6,624,597 | B2 | 9/2003 | Dowling et al. |
| D481,484 | S | 10/2003 | Cuevas et al. |
| 6,634,770 | B2 | 10/2003 | Cao |
| 6,634,779 | B2 | 10/2003 | Reed |
| 6,636,003 | B2 | 10/2003 | Rahm et al. |
| 6,639,349 | B1 | 10/2003 | Bahadur |
| 6,641,284 | B2 | 11/2003 | Stopa et al. |
| 6,652,117 | B2 | 11/2003 | Tsai |
| 6,659,622 | B2 | 12/2003 | Katogi et al. |
| 6,660,935 | B2 | 12/2003 | Southard et al. |
| 6,666,689 | B1 | 12/2003 | Savage, Jr. |
| 6,667,623 | B2 | 12/2003 | Bourgault et al. |
| 6,674,096 | B2 | 1/2004 | Sommers |
| 6,676,284 | B1 | 1/2004 | Wynne Willson |
| 6,679,621 | B2 | 1/2004 | West et al. |
| 6,681,154 | B2 | 1/2004 | Nierlich et al. |
| 6,682,205 | B2 | 1/2004 | Lin |
| 6,683,419 | B2 | 1/2004 | Kriparos |
| 6,700,136 | B2 | 3/2004 | Guida |
| 6,712,486 | B1 | 3/2004 | Popovich et al. |
| 6,717,376 | B2 | 4/2004 | Lys et al. |
| 6,717,526 | B2 | 4/2004 | Martineau et al. |
| 6,720,745 | B2 | 4/2004 | Lys et al. |
| 6,726,348 | B2 | 4/2004 | Gloisten |
| 6,741,324 | B1 | 5/2004 | Kim |
| D491,678 | S | 6/2004 | Piepgras |
| D492,042 | S | 6/2004 | Piepgras |
| 6,744,223 | B2 | 6/2004 | Laflamme et al. |
| 6,748,299 | B1 | 6/2004 | Motoyama |
| 6,762,562 | B2 | 7/2004 | Leong |
| 6,774,584 | B2 | 8/2004 | Lys et al. |
| 6,777,891 | B2 | 8/2004 | Lys et al. |
| 6,781,329 | B2 | 8/2004 | Mueller et al. |
| 6,787,999 | B2 | 9/2004 | Stimac et al. |
| 6,788,000 | B2 | 9/2004 | Appelberg et al. |
| 6,788,011 | B2 | 9/2004 | Mueller et al. |
| 6,791,840 | B2 | 9/2004 | Chun |
| 6,796,680 | B1 | 9/2004 | Showers et al. |
| 6,801,003 | B2 | 10/2004 | Schanberger et al. |
| 6,803,732 | B2 | 10/2004 | Kraus et al. |
| 6,806,659 | B1 | 10/2004 | Mueller et al. |
| 6,814,470 | B2 | 11/2004 | Rizkin et al. |
| 6,815,724 | B2 | 11/2004 | Dry |
| 6,846,094 | B2 | 1/2005 | Luk |
| 6,851,816 | B2 | 2/2005 | Wu et al. |
| 6,851,832 | B2 | 2/2005 | Tieszen |
| 6,853,150 | B2 | 2/2005 | Clauberg et al. |
| 6,853,151 | B2 | 2/2005 | Leong et al. |
| 6,853,563 | B1 | 2/2005 | Yang et al. |
| 6,857,924 | B2 | 2/2005 | Fu et al. |
| 6,860,628 | B2 | 3/2005 | Robertson et al. |
| 6,866,401 | B2 | 3/2005 | Sommers et al. |
| 6,869,204 | B2 | 3/2005 | Morgan et al. |
| 6,871,981 | B2 | 3/2005 | Alexanderson et al. |
| 6,874,924 | B1 | 4/2005 | Hulse et al. |
| 6,879,883 | B1 | 4/2005 | Motoyama |
| 6,882,111 | B2 | 4/2005 | Kan et al. |
| 6,883,929 | B2 | 4/2005 | Dowling |
| 6,883,934 | B2 | 4/2005 | Kawakami et al. |
| 6,888,322 | B2 | 5/2005 | Dowling et al. |
| 6,897,624 | B2 | 5/2005 | Lys et al. |
| 6,909,239 | B2 | 6/2005 | Gauna |
| 6,909,921 | B1 | 6/2005 | Bilger |
| 6,918,680 | B2 | 7/2005 | Seeberger |
| 6,921,181 | B2 | 7/2005 | Yen |
| 6,936,968 | B2 | 8/2005 | Cross et al. |
| 6,936,978 | B2 | 8/2005 | Morgan et al. |
| 6,940,230 | B2 | 9/2005 | Myron et al. |
| 6,948,829 | B2 | 9/2005 | Verdes et al. |

(56) References Cited

U.S. PATENT DOCUMENTS 6,957,905 B1 10/2005 Pritchard et al.
6,963,175 B2 11/2005 Archenhold et al.
6,964,501 B2 11/2005 Ryan
6,965,197 B2 11/2005 Tyan et al.
6,965,205 B2 11/2005 Piepgras et al.
6,967,448 B2 11/2005 Morgan et al.
6,969,179 B2 11/2005 Sloan et al.
6,969,186 B2 11/2005 Sonderegger et al.
6,969,954 B2 11/2005 Lys
6,975,079 B2 12/2005 Lys et al.
6,979,097 B2 12/2005 Elam et al.
6,982,518 B2 1/2006 Chou et al.
6,995,681 B2 2/2006 Pederson
6,997,576 B1 2/2006 Lodhie et al.
7,004,603 B2 2/2006 Knight
D518,218 S 3/2006 Roberge et al.
7,008,079 B2 3/2006 Smith
7,014,336 B1 3/2006 Ducharme et al.
7,015,650 B2 3/2006 McGrath
7,018,063 B2 3/2006 Michael et al.
7,021,799 B2 4/2006 Mizuyoshi
7,021,809 B2 4/2006 Iwasa et al.
7,024,256 B2 4/2006 Krzyzanowski et al.
7,031,920 B2 4/2006 Dowling et al.
7,033,036 B2 4/2006 Pederson
7,038,398 B1 5/2006 Lys et al.
7,038,399 B2 5/2006 Lys et al.
7,042,172 B2 5/2006 Dowling et al.
7,048,423 B2 5/2006 Stepanenko et al.
7,049,761 B2 5/2006 Timmermans et al.
7,052,171 B1 5/2006 Lefebvre et al.
7,053,557 B2 5/2006 Cross et al.
7,064,498 B2 6/2006 Dowling et al.
7,064,674 B2 6/2006 Pederson
7,067,992 B2 6/2006 Leong et al.
7,077,978 B2 7/2006 Setlur et al.
7,080,927 B2 7/2006 Feuerborn et al.
7,086,747 B2 8/2006 Nielson et al.
7,088,014 B2 8/2006 Nierlich et al.
7,088,904 B2 8/2006 Ryan, Jr.
7,102,902 B1 9/2006 Brown et al.
7,113,541 B1 9/2006 Lys et al.
7,114,830 B2 10/2006 Robertson et al.
7,114,834 B2 10/2006 Rivas et al.
7,118,262 B2 10/2006 Negley
7,119,503 B2 10/2006 Kemper
7,121,679 B2 10/2006 Fujimoto
7,122,976 B1 10/2006 Null et al.
7,128,442 B2 10/2006 Lee et al.
7,128,454 B2 10/2006 Kim et al.
D532,532 S 11/2006 Maxik
7,132,635 B2 11/2006 Dowling
7,132,785 B2 11/2006 Ducharme
7,132,804 B2 11/2006 Lys et al.
7,135,824 B2 11/2006 Lys et al.
7,139,617 B1 11/2006 Morgan et al.
7,144,135 B2 12/2006 Martin et al.
7,153,002 B2 12/2006 Kim et al.
7,161,311 B2 1/2007 Mueller et al.
7,161,313 B2 1/2007 Piepgras et al.
7,161,556 B2 1/2007 Morgan et al.
7,164,110 B2 1/2007 Pitigoi-Aron et al.
7,164,235 B2 1/2007 Ito et al.
7,165,863 B1 1/2007 Thomas et al.
7,165,866 B2 1/2007 Li
7,167,777 B2 1/2007 Budike, Jr.
7,168,843 B2 1/2007 Striebel
D536,468 S 2/2007 Crosby
7,178,941 B2 2/2007 Roberge et al.
7,180,252 B2 2/2007 Lys et al.
D538,950 S 3/2007 Maxik
D538,952 S 3/2007 Maxik et al.
D538,962 S 3/2007 Elliott
7,186,003 B2 3/2007 Dowling et al.
7,186,005 B2 3/2007 Hulse
7,187,141 B2 3/2007 Mueller et al.
7,190,126 B1 3/2007 Paton
7,192,154 B2 3/2007 Becker
7,198,387 B1 4/2007 Gloisten et al.
7,201,491 B2 4/2007 Bayat et al.
7,201,497 B2 4/2007 Weaver, Jr. et al.
7,202,613 B2 4/2007 Morgan et al.
7,204,615 B2 4/2007 Arik et al.
7,204,622 B2 4/2007 Dowling et al.
7,207,696 B1 4/2007 Lin
7,210,818 B2 5/2007 Luk et al.
7,210,957 B2 5/2007 Mrakovich
7,211,959 B1 5/2007 Chou
7,213,934 B2 5/2007 Zarian et al.
7,217,004 B2 5/2007 Park et al.
7,217,012 B2 5/2007 Southard et al.
7,217,022 B2 5/2007 Ruffin
7,218,056 B1 5/2007 Harwood
7,218,238 B2 5/2007 Right et al.
7,220,015 B2 5/2007 Dowling
7,220,018 B2 5/2007 Crabb et al.
7,221,104 B2 5/2007 Lys et al.
7,221,110 B2 5/2007 Sears et al.
7,224,000 B2 5/2007 Aanegola et al.
7,226,189 B2 6/2007 Lee et al.
7,228,052 B1 6/2007 Lin
7,228,190 B2 6/2007 Dowling et al.
7,231,060 B2 6/2007 Dowling et al.
7,233,115 B2 6/2007 Lys
7,233,831 B2 6/2007 Blackwell
7,236,366 B2 6/2007 Chen
7,237,924 B2 7/2007 Martineau et al.
7,237,925 B2 7/2007 Mayer et al.
7,239,532 B1 7/2007 Hsu et al.
7,241,038 B2 7/2007 Naniwa et al.
7,242,152 B2 7/2007 Dowling et al.
7,246,926 B2 7/2007 Harwood
7,246,931 B2 7/2007 Hsieh et al.
7,248,239 B2 7/2007 Dowling et al.
7,249,269 B1 7/2007 Motoyama
7,249,865 B2 7/2007 Robertson
D548,868 S 8/2007 Roberge et al.
7,252,408 B2 8/2007 Mazzochette et al.
7,253,566 B2 8/2007 Lys et al.
7,255,457 B2 8/2007 Ducharme et al.
7,255,460 B2 8/2007 Lee
7,256,554 B2 8/2007 Lys
7,258,458 B2 8/2007 Mochiachvili et al.
7,258,467 B2 8/2007 Saccomanno et al.
7,259,528 B2 8/2007 Pilz
7,262,439 B2 8/2007 Setlur et al.
7,264,372 B2 9/2007 Maglica
7,267,467 B2 9/2007 Wu et al.
7,270,443 B2 9/2007 Kurtz et al.
7,271,794 B1 9/2007 Cheng et al.
7,273,300 B2 9/2007 Mrakovich
7,274,045 B2 9/2007 Chandran et al.
7,274,160 B2 9/2007 Mueller et al.
D553,267 S 10/2007 Yuen
7,285,801 B2 10/2007 Eliashevich et al.
7,288,902 B1 10/2007 Melanson
7,296,912 B2 11/2007 Beauchamp
7,300,184 B2 11/2007 Ichikawa et al.
7,300,192 B2 11/2007 Mueller et al.
D556,937 S 12/2007 Ly
D557,854 S 12/2007 Lewis
7,303,300 B2 12/2007 Dowling et al.
7,306,353 B2 12/2007 Popovich et al.
7,307,391 B2 12/2007 Shan
7,308,296 B2 12/2007 Lys et al.
7,309,965 B2 12/2007 Dowling et al.
7,318,658 B2 1/2008 Wang et al.
7,319,244 B2 1/2008 Liu et al.
7,319,246 B2 1/2008 Soules et al.
7,321,191 B2 1/2008 Setlur et al.
7,326,964 B2 2/2008 Lim et al.
7,327,281 B2 2/2008 Hutchison
7,329,031 B2 2/2008 Liaw et al.
D563,589 S 3/2008 Hariri et al.

(56) References Cited

U.S. PATENT DOCUMENTS

| | | | |
|---|---|---|---|
| 7,345,320 | B2 | 3/2008 | Dahm |
| 7,348,604 | B2 | 3/2008 | Matheson |
| 7,350,936 | B2 | 4/2008 | Ducharme et al. |
| 7,350,952 | B2 | 4/2008 | Nishigaki |
| 7,352,138 | B2 | 4/2008 | Lys et al. |
| 7,352,339 | B2 | 4/2008 | Morgan et al. |
| 7,353,071 | B2 | 4/2008 | Blackwell et al. |
| 7,358,679 | B2 | 4/2008 | Lys et al. |
| 7,358,929 | B2 | 4/2008 | Mueller et al. |
| 7,374,327 | B2 | 5/2008 | Schexnaider |
| 7,385,359 | B2 | 6/2008 | Dowling et al. |
| 7,391,159 | B2 | 6/2008 | Harwood |
| 7,396,146 | B2 | 7/2008 | Wang |
| 7,401,935 | B2 | 7/2008 | VanderSchuit |
| 7,401,945 | B2 | 7/2008 | Zhang |
| 7,427,840 | B2 | 9/2008 | Morgan et al. |
| 7,429,117 | B2 | 9/2008 | Pohlert et al. |
| 7,434,964 | B1 | 10/2008 | Zheng et al. |
| 7,438,441 | B2 | 10/2008 | Sun et al. |
| D580,089 | S | 11/2008 | Ly et al. |
| D581,556 | S | 11/2008 | To et al. |
| 7,449,847 | B2 | 11/2008 | Schanberger et al. |
| D582,577 | S | 12/2008 | Yuen |
| D584,428 | S | 1/2009 | Li et al. |
| 7,476,002 | B2 | 1/2009 | Wolf et al. |
| 7,476,004 | B2 | 1/2009 | Chan |
| 7,478,924 | B2 | 1/2009 | Robertson |
| D586,484 | S | 2/2009 | Liu et al. |
| D586,928 | S | 2/2009 | Liu et al. |
| 7,490,957 | B2 | 2/2009 | Leong et al. |
| 7,497,596 | B2 | 3/2009 | Ge |
| 7,507,001 | B2 | 3/2009 | Kit |
| 7,510,299 | B2 | 3/2009 | Timmermans et al. |
| 7,514,876 | B2 | 4/2009 | Roach, Jr. |
| 7,520,635 | B2 | 4/2009 | Wolf et al. |
| 7,521,872 | B2 | 4/2009 | Bruning |
| 7,524,089 | B2 | 4/2009 | Park |
| D592,766 | S | 5/2009 | Zhu et al. |
| D593,223 | S | 5/2009 | Komar |
| 7,534,002 | B2 | 5/2009 | Yamaguchi et al. |
| 7,549,769 | B2 | 6/2009 | Kim et al. |
| 7,556,396 | B2 | 7/2009 | Kuo et al. |
| 7,572,030 | B2 | 8/2009 | Booth et al. |
| 7,575,339 | B2 | 8/2009 | Hung |
| 7,579,786 | B2 | 8/2009 | Soos |
| 7,583,035 | B2 | 9/2009 | Shteynberg et al. |
| 7,594,738 | B1 | 9/2009 | Lin et al. |
| 7,602,559 | B2 | 10/2009 | Jang et al. |
| 7,619,366 | B2 | 11/2009 | Diederiks |
| 7,635,201 | B2 | 12/2009 | Deng |
| 7,639,517 | B2 | 12/2009 | Zhou et al. |
| D612,528 | S | 3/2010 | McGrath et al. |
| 7,690,813 | B2 | 4/2010 | Kanamori et al. |
| 7,710,047 | B2 | 5/2010 | Shteynberg et al. |
| 7,712,918 | B2 | 5/2010 | Siemiet et al. |
| 7,828,471 | B2 | 11/2010 | Lin |
| 7,843,150 | B2 | 11/2010 | Wang et al. |
| RE42,161 | E | 2/2011 | Hochstein |
| 7,887,226 | B2 | 2/2011 | Huang et al. |
| 7,990,070 | B2 | 8/2011 | Nerone |
| 2001/0033488 | A1 | 10/2001 | Chliwnyj et al. |
| 2001/0045803 | A1 | 11/2001 | Cencur |
| 2002/0011801 | A1 | 1/2002 | Chang |
| 2002/0015297 | A1 | 2/2002 | Hayashi et al. |
| 2002/0038157 | A1 | 3/2002 | Dowling et al. |
| 2002/0044066 | A1 | 4/2002 | Dowling et al. |
| 2002/0047569 | A1 | 4/2002 | Dowling et al. |
| 2002/0047624 | A1 | 4/2002 | Stam et al. |
| 2002/0047628 | A1 | 4/2002 | Morgan et al. |
| 2002/0048169 | A1 | 4/2002 | Dowling et al. |
| 2002/0057061 | A1 | 5/2002 | Mueller et al. |
| 2002/0060526 | A1 | 5/2002 | Timmermans et al. |
| 2002/0070688 | A1 | 6/2002 | Dowling et al. |
| 2002/0074559 | A1 | 6/2002 | Dowling et al. |
| 2002/0074958 | A1 | 6/2002 | Crenshaw |
| 2002/0078221 | A1 | 6/2002 | Blackwell et al. |
| 2002/0101197 | A1 | 8/2002 | Lys et al. |
| 2002/0113555 | A1 | 8/2002 | Lys et al. |
| 2002/0130627 | A1 | 9/2002 | Morgan et al. |
| 2002/0145394 | A1 | 10/2002 | Morgan et al. |
| 2002/0145869 | A1 | 10/2002 | Dowling |
| 2002/0152045 | A1 | 10/2002 | Dowling et al. |
| 2002/0152298 | A1 | 10/2002 | Kikta et al. |
| 2002/0153851 | A1 | 10/2002 | Morgan et al. |
| 2002/0158583 | A1 | 10/2002 | Lys et al. |
| 2002/0163316 | A1 | 11/2002 | Lys et al. |
| 2002/0171365 | A1 | 11/2002 | Morgan et al. |
| 2002/0171377 | A1 | 11/2002 | Mueller et al. |
| 2002/0171378 | A1 | 11/2002 | Morgan et al. |
| 2002/0176259 | A1 | 11/2002 | Ducharme |
| 2002/0179816 | A1 | 12/2002 | Haines et al. |
| 2002/0195975 | A1 | 12/2002 | Schanberger et al. |
| 2003/0011538 | A1 | 1/2003 | Lys et al. |
| 2003/0028260 | A1 | 2/2003 | Blackwell |
| 2003/0031015 | A1 | 2/2003 | Ishibashi |
| 2003/0048641 | A1 | 3/2003 | Alexanderson et al. |
| 2003/0057884 | A1 | 3/2003 | Dowling et al. |
| 2003/0057886 | A1 | 3/2003 | Lys et al. |
| 2003/0057887 | A1 | 3/2003 | Dowling et al. |
| 2003/0057890 | A1 | 3/2003 | Lys et al. |
| 2003/0076281 | A1 | 4/2003 | Morgan et al. |
| 2003/0085710 | A1 | 5/2003 | Bourgault et al. |
| 2003/0095404 | A1 | 5/2003 | Becks et al. |
| 2003/0100837 | A1 | 5/2003 | Lys et al. |
| 2003/0102810 | A1 | 6/2003 | Cross et al. |
| 2003/0133292 | A1 | 7/2003 | Mueller et al. |
| 2003/0137258 | A1 | 7/2003 | Piepgras et al. |
| 2003/0185005 | A1 | 10/2003 | Sommers et al. |
| 2003/0185014 | A1 | 10/2003 | Gloisten |
| 2003/0189412 | A1 | 10/2003 | Cunningham |
| 2003/0218879 | A1 | 11/2003 | Tieszen |
| 2003/0222587 | A1 | 12/2003 | Dowling, Jr. et al. |
| 2004/0003545 | A1 | 1/2004 | Gillespie |
| 2004/0012959 | A1 | 1/2004 | Robertson et al. |
| 2004/0036006 | A1 | 2/2004 | Dowling |
| 2004/0037088 | A1 | 2/2004 | English et al. |
| 2004/0052076 | A1 | 3/2004 | Mueller et al. |
| 2004/0062041 | A1 | 4/2004 | Cross et al. |
| 2004/0075572 | A1 | 4/2004 | Buschmann et al. |
| 2004/0080960 | A1 | 4/2004 | Wu |
| 2004/0090191 | A1 | 5/2004 | Mueller et al. |
| 2004/0090787 | A1 | 5/2004 | Dowling et al. |
| 2004/0105261 | A1 | 6/2004 | Ducharme et al. |
| 2004/0105264 | A1 | 6/2004 | Spero |
| 2004/0113568 | A1 | 6/2004 | Dowling et al. |
| 2004/0116039 | A1 | 6/2004 | Mueller et al. |
| 2004/0124782 | A1 | 7/2004 | Yu |
| 2004/0130909 | A1 | 7/2004 | Mueller et al. |
| 2004/0141321 | A1 | 7/2004 | Dowling et al. |
| 2004/0155609 | A1 | 8/2004 | Lys et al. |
| 2004/0160199 | A1 | 8/2004 | Morgan et al. |
| 2004/0178751 | A1 | 9/2004 | Mueller et al. |
| 2004/0189218 | A1 | 9/2004 | Leong et al. |
| 2004/0189262 | A1 | 9/2004 | McGrath |
| 2004/0212320 | A1 | 10/2004 | Dowling et al. |
| 2004/0212321 | A1 | 10/2004 | Lys et al. |
| 2004/0212993 | A1 | 10/2004 | Morgan et al. |
| 2004/0223328 | A1 | 11/2004 | Lee et al. |
| 2004/0240890 | A1 | 12/2004 | Lys et al. |
| 2004/0251854 | A1 | 12/2004 | Matsuda et al. |
| 2004/0257007 | A1 | 12/2004 | Lys et al. |
| 2005/0013133 | A1 | 1/2005 | Yeh |
| 2005/0024877 | A1 | 2/2005 | Frederick |
| 2005/0030744 | A1 | 2/2005 | Ducharme et al. |
| 2005/0035728 | A1 | 2/2005 | Schanberger et al. |
| 2005/0036300 | A1 | 2/2005 | Dowling et al. |
| 2005/0040774 | A1 | 2/2005 | Mueller et al. |
| 2005/0041161 | A1 | 2/2005 | Dowling et al. |
| 2005/0041424 | A1 | 2/2005 | Ducharme |
| 2005/0043907 | A1 | 2/2005 | Eckel et al. |
| 2005/0044617 | A1 | 3/2005 | Mueller et al. |
| 2005/0047132 | A1 | 3/2005 | Dowling et al. |
| 2005/0047134 | A1 | 3/2005 | Mueller et al. |
| 2005/0062440 | A1 | 3/2005 | Lys et al. |

(56) References Cited

U.S. PATENT DOCUMENTS

2005/0063194 A1 3/2005 Lys et al.
2005/0078477 A1 4/2005 Lo
2005/0099824 A1 5/2005 Dowling et al.
2005/0107694 A1 5/2005 Jansen et al.
2005/0110384 A1 5/2005 Peterson
2005/0116667 A1 6/2005 Mueller et al.
2005/0128751 A1 6/2005 Roberge et al.
2005/0141225 A1 6/2005 Striebel
2005/0151489 A1 7/2005 Lys et al.
2005/0151663 A1 7/2005 Tanguay
2005/0154494 A1 7/2005 Ahmed
2005/0162100 A1 7/2005 Romano et al.
2005/0174473 A1 8/2005 Morgan et al.
2005/0174780 A1 8/2005 Park
2005/0184667 A1 8/2005 Sturman et al.
2005/0201112 A1 9/2005 Machi et al.
2005/0206529 A1 9/2005 St.-Germain
2005/0213320 A1 9/2005 Kazuhiro et al.
2005/0213352 A1 9/2005 Lys
2005/0213353 A1 9/2005 Lys
2005/0218838 A1 10/2005 Lys
2005/0218870 A1 10/2005 Lys
2005/0219860 A1 10/2005 Schexnaider
2005/0219872 A1 10/2005 Lys
2005/0225979 A1 10/2005 Robertson et al.
2005/0231133 A1 10/2005 Lys
2005/0236029 A1 10/2005 Dowling
2005/0236998 A1 10/2005 Mueller et al.
2005/0248299 A1 11/2005 Chemel et al.
2005/0253533 A1 11/2005 Lys et al.
2005/0259424 A1 11/2005 Zampini et al.
2005/0265019 A1 12/2005 Sommers et al.
2005/0275626 A1 12/2005 Mueller et al.
2005/0276051 A1 12/2005 Caudle et al.
2005/0276053 A1 12/2005 Nortrup et al.
2005/0276064 A1 12/2005 Wu et al.
2005/0285547 A1 12/2005 Piepgras et al.
2006/0002110 A1 1/2006 Dowling et al.
2006/0012987 A9 1/2006 Ducharme et al.
2006/0012997 A1 1/2006 Catalano et al.
2006/0016960 A1 1/2006 Morgan et al.
2006/0022214 A1 2/2006 Morgan et al.
2006/0028155 A1 2/2006 Young
2006/0028837 A1 2/2006 Mrakovich
2006/0034078 A1 2/2006 Kovacik et al.
2006/0050509 A9 3/2006 Dowling et al.
2006/0050514 A1 3/2006 Opolka
2006/0076908 A1 4/2006 Morgan et al.
2006/0092640 A1 5/2006 Li
2006/0098077 A1 5/2006 Dowling
2006/0104058 A1 5/2006 Chemel et al.
2006/0109648 A1 5/2006 Trenchard et al.
2006/0109649 A1 5/2006 Ducharme et al.
2006/0109661 A1 5/2006 Coushaine et al.
2006/0126325 A1 6/2006 Lefebvre et al.
2006/0126338 A1 6/2006 Mighetto
2006/0132061 A1 6/2006 McCormick et al.
2006/0132323 A1 6/2006 Grady, Jr.
2006/0146531 A1 7/2006 Reo et al.
2006/0152172 A9 7/2006 Mueller et al.
2006/0158881 A1 7/2006 Dowling
2006/0170376 A1 8/2006 Piepgras et al.
2006/0192502 A1 8/2006 Brown et al.
2006/0193131 A1 8/2006 McGrath et al.
2006/0197661 A1 9/2006 Tracy et al.
2006/0198128 A1 9/2006 Piepgras et al.
2006/0208667 A1 9/2006 Lys et al.
2006/0220595 A1 10/2006 Lu
2006/0221606 A1 10/2006 Dowling et al.
2006/0221619 A1 10/2006 Nishigaki
2006/0232974 A1 10/2006 Lee et al.
2006/0262516 A9 11/2006 Dowling et al.
2006/0262521 A1 11/2006 Piepgras et al.
2006/0262544 A1 11/2006 Piepgras et al.
2006/0262545 A1 11/2006 Piepgras et al.
2006/0265921 A1 11/2006 Korall et al.
2006/0273741 A1 12/2006 Stalker, III
2006/0274529 A1 12/2006 Cao
2006/0285325 A1 12/2006 Ducharme et al.
2007/0035255 A1 2/2007 Shuster et al.
2007/0035538 A1 2/2007 Garcia et al.
2007/0035965 A1 2/2007 Holst
2007/0040516 A1 2/2007 Chen
2007/0041220 A1 2/2007 Lynch
2007/0047227 A1 3/2007 Ducharme
2007/0053182 A1 3/2007 Robertson
2007/0053208 A1 3/2007 Justel et al.
2007/0064419 A1 3/2007 Gandhi
2007/0064425 A1 3/2007 Frecska et al.
2007/0070621 A1 3/2007 Rivas et al.
2007/0070631 A1 3/2007 Huang et al.
2007/0081423 A1 4/2007 Chien
2007/0086754 A1 4/2007 Lys et al.
2007/0086912 A1 4/2007 Dowling et al.
2007/0097678 A1 5/2007 Yang
2007/0109763 A1 5/2007 Wolf et al.
2007/0115658 A1 5/2007 Mueller et al.
2007/0115665 A1 5/2007 Mueller et al.
2007/0120594 A1 5/2007 Balakrishnan et al.
2007/0127234 A1 6/2007 Jervey, III
2007/0133202 A1 6/2007 Huang et al.
2007/0139938 A1 6/2007 Petroski et al.
2007/0145915 A1 6/2007 Roberge et al.
2007/0147046 A1 6/2007 Arik et al.
2007/0152797 A1 7/2007 Chemel et al.
2007/0152808 A1 7/2007 LaCasse
2007/0153514 A1 7/2007 Dowling et al.
2007/0159828 A1 7/2007 Wang
2007/0165402 A1 7/2007 Weaver et al.
2007/0173978 A1 7/2007 Fein et al.
2007/0177382 A1 8/2007 Pritchard et al.
2007/0182387 A1 8/2007 Weirich
2007/0188114 A1 8/2007 Lys et al.
2007/0188427 A1 8/2007 Lys et al.
2007/0189026 A1 8/2007 Chemel et al.
2007/0195526 A1 8/2007 Dowling et al.
2007/0195527 A1 8/2007 Russell
2007/0195532 A1 8/2007 Reisenauer et al.
2007/0205712 A1 9/2007 Radkov et al.
2007/0206375 A1 9/2007 Piepgras et al.
2007/0211463 A1 9/2007 Chevalier et al.
2007/0228999 A1 10/2007 Kit
2007/0235751 A1 10/2007 Radkov et al.
2007/0236156 A1 10/2007 Lys et al.
2007/0237284 A1 10/2007 Lys et al.
2007/0240346 A1 10/2007 Li et al.
2007/0241657 A1 10/2007 Radkov et al.
2007/0242466 A1 10/2007 Wu et al.
2007/0247450 A1 10/2007 Lee
2007/0247842 A1 10/2007 Zampini et al.
2007/0247847 A1 10/2007 Villard
2007/0247851 A1 10/2007 Villard
2007/0258231 A1 11/2007 Koerner et al.
2007/0258240 A1 11/2007 Ducharme et al.
2007/0263379 A1 11/2007 Dowling
2007/0274070 A1 11/2007 Wedell
2007/0281520 A1 12/2007 Insalaco et al.
2007/0285926 A1 12/2007 Maxik
2007/0285933 A1 12/2007 Southard et al.
2007/0290625 A1 12/2007 He et al.
2007/0291483 A1 12/2007 Lys
2007/0296350 A1 12/2007 Maxik et al.
2008/0003664 A1 1/2008 Tysoe et al.
2008/0007945 A1 1/2008 Kelly et al.
2008/0012502 A1 1/2008 Lys
2008/0012506 A1 1/2008 Mueller et al.
2008/0013316 A1 1/2008 Chiang
2008/0013324 A1 1/2008 Yu
2008/0018261 A1 1/2008 Kastner
2008/0024067 A1 1/2008 Ishibashi
2008/0037226 A1 2/2008 Shin et al.
2008/0037245 A1 2/2008 Chan
2008/0037284 A1 2/2008 Rudisill
2008/0062680 A1 3/2008 Timmermans et al.

(56) References Cited

U.S. PATENT DOCUMENTS

| | | | |
|---|---|---|---|
| 2008/0089075 | A1 | 4/2008 | Hsu |
| 2008/0092800 | A1 | 4/2008 | Smith et al. |
| 2008/0093615 | A1 | 4/2008 | Lin et al. |
| 2008/0093998 | A1 | 4/2008 | Dennery et al. |
| 2008/0094837 | A1 | 4/2008 | Dobbins et al. |
| 2008/0130267 | A1 | 6/2008 | Dowling et al. |
| 2008/0151535 | A1 | 6/2008 | de Castris |
| 2008/0158871 | A1 | 7/2008 | McAvoy et al. |
| 2008/0158887 | A1 | 7/2008 | Zhu et al. |
| 2008/0164826 | A1 | 7/2008 | Lys |
| 2008/0164827 | A1 | 7/2008 | Lys |
| 2008/0164854 | A1 | 7/2008 | Lys |
| 2008/0175003 | A1 | 7/2008 | Tsou et al. |
| 2008/0180036 | A1 | 7/2008 | Garrity et al. |
| 2008/0186704 | A1 | 8/2008 | Chou et al. |
| 2008/0192436 | A1 | 8/2008 | Peng et al. |
| 2008/0198598 | A1 | 8/2008 | Ward |
| 2008/0211386 | A1 | 9/2008 | Choi et al. |
| 2008/0211419 | A1 | 9/2008 | Garrity |
| 2008/0218993 | A1 | 9/2008 | Li |
| 2008/0224629 | A1 | 9/2008 | Melanson |
| 2008/0224636 | A1 | 9/2008 | Melanson |
| 2008/0253125 | A1 | 10/2008 | Kang et al. |
| 2008/0258647 | A1 | 10/2008 | Scianna |
| 2008/0285257 | A1 | 11/2008 | King |
| 2008/0285266 | A1 | 11/2008 | Thomas |
| 2008/0290814 | A1 | 11/2008 | Leong et al. |
| 2008/0291675 | A1 | 11/2008 | Lin et al. |
| 2008/0315773 | A1 | 12/2008 | Pang |
| 2008/0315784 | A1 | 12/2008 | Tseng |
| 2009/0002995 | A1 | 1/2009 | Lee et al. |
| 2009/0016063 | A1 | 1/2009 | Hu |
| 2009/0021140 | A1 | 1/2009 | Takasu et al. |
| 2009/0046473 | A1 | 2/2009 | Tsai et al. |
| 2009/0052186 | A1 | 2/2009 | Xue |
| 2009/0067182 | A1 | 3/2009 | Hsu et al. |
| 2009/0086492 | A1 | 4/2009 | Meyer |
| 2009/0091938 | A1 | 4/2009 | Jacobson et al. |
| 2009/0140285 | A1 | 6/2009 | Lin et al. |
| 2009/0175041 | A1 | 7/2009 | Yuen et al. |
| 2009/0185373 | A1 | 7/2009 | Grajcar |
| 2009/0195186 | A1 | 8/2009 | Guest et al. |
| 2009/0196034 | A1 | 8/2009 | Gherardini et al. |
| 2009/0213588 | A1 | 8/2009 | Manes |
| 2009/0273926 | A1 | 11/2009 | Deng |
| 2009/0303720 | A1 | 12/2009 | McGrath |
| 2009/0316408 | A1 | 12/2009 | Villard |
| 2010/0008085 | A1 | 1/2010 | Ivey et al. |
| 2010/0019689 | A1 | 1/2010 | Shan |
| 2010/0027259 | A1 | 2/2010 | Simon et al. |
| 2010/0033095 | A1 | 2/2010 | Sadwick |
| 2010/0033964 | A1 | 2/2010 | Choi et al. |
| 2010/0046222 | A1 | 2/2010 | Yang |
| 2010/0096992 | A1 | 4/2010 | Yamamoto et al. |
| 2010/0096998 | A1 | 4/2010 | Beers |
| 2010/0103664 | A1 | 4/2010 | Simon et al. |
| 2010/0109550 | A1 | 5/2010 | Huda et al. |
| 2010/0109558 | A1 | 5/2010 | Chew |
| 2010/0164404 | A1 | 7/2010 | Shao et al. |
| 2010/0265732 | A1 | 10/2010 | Liu |
| 2010/0270925 | A1 | 10/2010 | Withers |
| 2010/0277069 | A1 | 11/2010 | Janik et al. |
| 2010/0289418 | A1 | 11/2010 | Langovsky |
| 2011/0090682 | A1 | 4/2011 | Zheng et al. |
| 2011/0156584 | A1 | 6/2011 | Kim |
| 2011/0176298 | A1 | 7/2011 | Meurer et al. |
| 2011/0199769 | A1 | 8/2011 | Bretschneider et al. |

FOREIGN PATENT DOCUMENTS

| | | | |
|---|---|---|---|
| CN | 2869556 | Y | 2/2007 |
| EP | 0013782 | B1 | 3/1983 |
| EP | 0091172 | A2 | 10/1983 |
| EP | 0124924 | B1 | 9/1987 |
| EP | 0174699 | B1 | 11/1988 |
| EP | 0197602 | B1 | 11/1990 |
| EP | 0262713 | B1 | 6/1992 |
| EP | 0203668 | B1 | 2/1993 |
| EP | 0337567 | B1 | 11/1993 |
| EP | 0390262 | B1 | 12/1993 |
| EP | 0359329 | B1 | 3/1994 |
| EP | 0403011 | B1 | 4/1994 |
| EP | 0632511 | A2 | 1/1995 |
| EP | 0432848 | B1 | 4/1995 |
| EP | 0403001 | B1 | 8/1995 |
| EP | 0525876 | B1 | 5/1996 |
| EP | 0714556 | B1 | 1/1999 |
| EP | 0458408 | B1 | 9/1999 |
| EP | 0578302 | B1 | 9/1999 |
| EP | 0723701 | B1 | 1/2000 |
| EP | 0787419 | B1 | 5/2001 |
| EP | 1195740 | A2 | 4/2002 |
| EP | 1016062 | B1 | 8/2002 |
| EP | 1195740 | A3 | 1/2003 |
| EP | 1149510 | B1 | 2/2003 |
| EP | 1056993 | B1 | 3/2003 |
| EP | 0766436 | B1 | 5/2003 |
| EP | 0924281 | B1 | 5/2003 |
| EP | 0826167 | B1 | 6/2003 |
| EP | 1147686 | B1 | 1/2004 |
| EP | 1142452 | B1 | 3/2004 |
| EP | 1145602 | B1 | 3/2004 |
| EP | 1422975 | A1 | 5/2004 |
| EP | 0890059 | B1 | 6/2004 |
| EP | 1348319 | B1 | 6/2005 |
| EP | 1037862 | B1 | 7/2005 |
| EP | 1346609 | B1 | 8/2005 |
| EP | 1321012 | B1 | 12/2005 |
| EP | 1610593 | A2 | 12/2005 |
| EP | 1624728 | A1 | 2/2006 |
| EP | 1415517 | B1 | 5/2006 |
| EP | 1415518 | B1 | 5/2006 |
| EP | 1438877 | B1 | 5/2006 |
| EP | 1166604 | B1 | 6/2006 |
| EP | 1479270 | B1 | 7/2006 |
| EP | 1348318 | B1 | 8/2006 |
| EP | 1399694 | B1 | 8/2006 |
| EP | 1461980 | B1 | 10/2006 |
| EP | 1110120 | B1 | 4/2007 |
| EP | 1440604 | B1 | 4/2007 |
| EP | 1047903 | B1 | 6/2007 |
| EP | 1500307 | B1 | 6/2007 |
| EP | 0922305 | B1 | 8/2007 |
| EP | 0922306 | B1 | 8/2007 |
| EP | 1194918 | B1 | 8/2007 |
| EP | 1048085 | B1 | 11/2007 |
| EP | 1763650 | B1 | 12/2007 |
| EP | 1776722 | B1 | 1/2008 |
| EP | 1459599 | B1 | 2/2008 |
| EP | 1887836 | A2 | 2/2008 |
| EP | 1579733 | B1 | 4/2008 |
| EP | 1145282 | B1 | 7/2008 |
| EP | 1157428 | B1 | 9/2008 |
| EP | 1000522 | B1 | 12/2008 |
| EP | 1502483 | B1 | 12/2008 |
| EP | 1576858 | B1 | 12/2008 |
| EP | 1646092 | B1 | 1/2009 |
| EP | 1579736 | B1 | 2/2009 |
| EP | 1889519 | B1 | 3/2009 |
| EP | 1537354 | B1 | 4/2009 |
| EP | 1518445 | B1 | 5/2009 |
| EP | 1337784 | B1 | 6/2009 |
| EP | 2013530 | B1 | 8/2009 |
| EP | 1461982 | B1 | 9/2009 |
| GB | 2215024 | A | 9/1989 |
| GB | 2324901 | A | 11/1998 |
| JP | 06-054289 | | 2/1994 |
| JP | 6-54103 | U | 7/1994 |
| JP | 08-162677 | | 7/1994 |
| JP | 7-249467 | | 9/1995 |
| JP | 7264036 | | 10/1995 |
| JP | 11-135274 | A | 5/1999 |
| JP | 2001-238272 | A | 8/2001 |

(56) References Cited

FOREIGN PATENT DOCUMENTS

| | | | |
|---|---|---|---|
| JP | 2002-141555 | A | 5/2002 |
| JP | 3098271 | U | 2/2004 |
| JP | 2004119078 | A | 4/2004 |
| JP | 2004-335426 | | 11/2004 |
| JP | 2005-158363 | A | 6/2005 |
| JP | 2005-166617 | A | 6/2005 |
| JP | 2005-347214 | A | 12/2005 |
| JP | 2006-507641 | A | 3/2006 |
| JP | 3139714 | U | 2/2008 |
| JP | 2008186758 | A | 8/2008 |
| JP | 2008-258124 | A | 10/2008 |
| JP | 2008293753 | A | 12/2008 |
| JP | 3154200 | | 9/2009 |
| KR | 10-2004-0008244 | A | 1/2004 |
| KR | 20-0430022 | Y1 | 11/2006 |
| KR | 10-0781652 | B1 | 12/2007 |
| KR | 100844538 | B1 | 7/2008 |
| KR | 100888669 | B1 | 3/2009 |
| KR | 100927851 | B1 | 11/2009 |
| TW | M337036 | | 7/2008 |
| WO | 9906759 | A1 | 2/1999 |
| WO | 99/10867 | A1 | 3/1999 |
| WO | 99/31560 | A2 | 6/1999 |
| WO | 9945312 | A1 | 9/1999 |
| WO | 9957945 | A1 | 11/1999 |
| WO | 00/01067 | A2 | 1/2000 |
| WO | 02/25842 | A2 | 3/2002 |
| WO | 02/061330 | A2 | 8/2002 |
| WO | 02/069306 | A2 | 9/2002 |
| WO | 02/091805 | A2 | 11/2002 |
| WO | 02/098182 | A2 | 12/2002 |
| WO | 02/099780 | A2 | 12/2002 |
| WO | 03/026358 | A1 | 3/2003 |
| WO | 03/055273 | A2 | 7/2003 |
| WO | 03/067934 | A2 | 8/2003 |
| WO | 03/090890 | A1 | 11/2003 |
| WO | 03/096761 | A1 | 11/2003 |
| WO | 2004/021747 | A2 | 3/2004 |
| WO | 2004/023850 | A2 | 3/2004 |
| WO | 2004/032572 | A2 | 4/2004 |
| WO | 2004057924 | A1 | 7/2004 |
| WO | 2004/100624 | A2 | 11/2004 |
| WO | 2005031860 | A2 | 4/2005 |
| WO | 2005/052751 | A2 | 6/2005 |
| WO | 2005/060309 | A2 | 6/2005 |
| WO | 2005/084339 | A2 | 9/2005 |
| WO | 2005/089293 | A2 | 9/2005 |
| WO | 2005/089309 | A2 | 9/2005 |
| WO | 2006/023149 | A2 | 3/2006 |
| WO | 2006044328 | A1 | 4/2006 |
| WO | 2006056120 | A1 | 6/2006 |
| WO | 2006/093889 | A2 | 9/2006 |
| WO | 2006/127666 | A2 | 11/2006 |
| WO | 2006/127785 | A2 | 11/2006 |
| WO | 2006/133272 | A2 | 12/2006 |
| WO | 2006137686 | A1 | 12/2006 |
| WO | 2007/081674 | A1 | 7/2007 |
| WO | 2007/094810 | A2 | 8/2007 |
| WO | 2007090292 | A1 | 8/2007 |
| WO | 2008137460 | A2 | 11/2008 |
| WO | 2010014437 | A2 | 2/2010 |
| WO | 2010/030509 | A2 | 3/2010 |

OTHER PUBLICATIONS

Wolsey, Robert. Interoperable Systems: The Future of Lighting Control, Lighting Research Center, Jan. 1, 1997, vol. 2 No. 2, Rensselaer Polytechnic Institute, Troy, New York [online]. Retrieved Lighting Research Center Web Page using Internet <URL: http://www.lrc.rpi.edu/programs/Futures/LF-BAS/index.asp>.

Experiment Electronic Ballast. Electronic Ballast for Fluorescent Lamps [online], Revised Fall of 2007. [Retrieved on Sep. 1, 1997]. Retrieved from Virginia Tech Web Page using Internet <URL: http://www.ece.vt.edu/ece3354/labs/ballast.pdf.>.

Truck-Lite, LEDSelect—LED, Model 35, Clearance & Marker Lighting, [online], [retrieved on Jan. 13, 2000] Retrieved from Truck-Lite Web Page using Internet <URL: http://trucklite.com/leds14.html>.

Truck-Lite, LEDSelect—LED, Super 44, Stop, Turn & Tail Lighting, [online], [retrieved on Jan. 13, 2000] Retrieved from Truck-Lite Web Page using Internet <URL: http://trucklite.com/leds2.html>.

Truck-Lite, LEDSelect—LED, Model 45, Stop, Turn & Tail Lighting [online], [retrieved on Jan. 13, 2000] Retrieved from Truck-Lite Web Page using Internet <URL: http://trucklite.com/leds4.html>.

Telecite Products & Services—Display Options, [online], [retrieved on Jan. 13, 2000] Retrieved from Telecite Web page using Internet <URL: http://www.telecite.com/en/products/options en.htm>.

Traffic Signal Products—Transportation Products Group, [online], [retrieved on Jan. 13, 2000] Retrieved from the Dialight Web Page using Internet <URL: http://www.dialight.com/trans.htm>.

LED Lights, Replacement LED lamps for any incandescent light, [online], [retrieved on Jan. 13, 2000] Retrieved from LED Lights Web Page using Internet <URL: http://www.ledlights.com/replac.htm>.

LEDTRONICS, LEDTRONICS Catalog, 1996, p. 10, LEDTRONICS, Torrance, California.

Piper. The Best Path to Efficiency. Building Operating Management, Trade Press Publishing Company May 2000 [online], [retrieved on Jan. 17, 2008]. Retrieved from Find Articles Web Page using Internet <URL:http://findarticles.com/p/articles/mi__qu3922/is__200005/ai__n8899499/>.

Henson, Keith. The Benefits of Building Systems Integration, Access Control & Security Systems Integration, Oct. 1, 2000, Penton Media. [online], [retrieved on Oct. 24, 2008] Retrieved from Security Solutions Web page using Internet <URL: http://securitysolutions.com/mag/security__benefits__building__systems/>.

Phason Electronic Control Systems, Light Level Controller (LLC) case study. Nov. 30, 2004. 3 pages, Phason Inc., Winnipeg, Manitoba, Canada.

Airport International. Fly High With Intelligent Airport Building and Security Solutions [online], [retrieved on Oct. 24, 2008]. Retrieved from Airport International web page using Internet <URL: http://www.airport-int.com/categories/airport-building-and-security-solutions/fly-high-with-intelligent-airport-building-and-security-solutions.html>.

D.N.A.-III, [online], [retrieved Mar. 10, 2009] Retrieved from the PLC Lighting Web Page using Internet <URL: http://www.plclighting.com/product__info.php?cPath=1&products__id=92>.

E20116-18 Larmes Collection, [online], [retrieved on Jul. 10, 2010] Retrieved from ET2 Contemporary Lighting using Internet <URL: http://www.et2online.com/proddetail.aspx?ItemID=E20116-18>.

E20112-22 Starburst Collection, [online], [retrieved on Jul. 10, 2010] Retrieved from ET2 Contemporary Lighting using Internet <URL: http://www.et2online.com/proddetail.aspx?ItemID=E20112-22>.

E20524-10 & E20525-10 Curva Collection, [online], [retrieved on Jul. 10, 2010] Retrieved from ET2 Contemporary Lighting using Internet <URL: http://www.et2online.com/proddetail.aspx?ItemID=E20524-10 & E20525-10>.

E22201-44 Esprit Collection, [online], [retrieved on Jul. 10, 2010] Retrieved from ET2 Contemporary Lighting using Internet <URL: http://www.et2online.com/proddetail.aspx?ItemID=E22201-44>.

E20743-09 Stealth Collection, [online], [retrieved on Jul. 10, 2010] Retrieved from ET2 Contemporary Lighting using Internet <URL: http://www.et2online.com/proddetail.aspx?ItemID=E20743-09>.

Spencer, Eugene. High Sales, Low Utilization. Green Intelligent Buildings, Feb. 1, 2007. [online]. Retrieved from Green Intelligent Buildings web page using Internet <URL: http://www.greenintelligentbuildings.com/CDA/IBT$_{13}$ Archive/BNP__GUID__9-5-2006__A__10000000000000056772>.

Sensor Switch, nLight Lighting Control System, [online], [retrieved on Jan. 11, 2008] Retrieved from Sensor Switch web page using Internet <URL: http://www.sensorswitch.com>.

Six Strategies, [online], [retrieved on Jan. 11, 2008] Retrieved from Encelium Technologies Inc. Web Page using Internet <URL: http://www.encelium.com/products/strategies.html>.

Lawrence Berkeley National Labratory. Lighting Control System—Phase Cut Carrier. University of California, [online] [retrieved on

(56) References Cited

OTHER PUBLICATIONS

Jan. 14, 2008] Retrieved from Lawrence Berkeley National Labratory web page using Internet <URL: http://www.lbl.gov/tt/techs/lbnl1871.html>.

Best Practice Guide—Commercial Office Buildings—Central HVAC System. [online], [Retrieved on Jan. 17, 2008] Retrieved from Flex Your Power Organization web page using Internet <URL: http://www.fypower.org/bpg/module.html?b=offices&m+Central HVAC Systems&s=Contr...>.

Cornell University. Light Canopy—Cornell University Solar Decathlon, [online], [retrieved on Jan. 17, 2008] Retrieved from Cornell University web page using Internet <URL: http://cusd.cornell.edu/cusd/web/index.php/page/show/section/Design/page/controls>.

PLC-96973-PC PLC Lighting Elegance Modern/Contemporary Pendant Light, [online], [retrieved on Feb. 27, 2009] Retrieved from the Arcadian Lighting Web Page using Internet <URL: http/www.arcadianlighting.com/plc-96978-pc.html>.

PLC-81756-AL "Fireball" Contemporary Pendant Light, [online], [retrieved on Feb. 27, 2009] Retrieved from the Arcadian Lighting Web Page using Internet <URL: http://www.arcadianlighting .com/plc-81756-al.html>.

Philips. Sense and Simplicity—Licensing program for LED Luminaires and Retrofits, Philips Intellectual Property & Standards, May 5, 2009.

International Search Report and Written Opinion dated Jul. 17, 2009 from the corresponding International Application No. PCT/US2008/085118 filed Dec. 1, 2008.

International Search Report and Written Opinion dated Aug. 25, 2009 from corresponding International Application No. PCT/US2009/031049 filed Jan. 15, 2009.

International Search Report and Written Opinion dated Jan. 4, 2010 from the corresponding International Application No. PCT/US2009/044313 filed May 18, 2009.

International Search Report and Written Opinion dated Jan. 25, 2010 from the corresponding International Application No. PCT/US2009/048623 filed Jun. 25, 2009.

International Search Report and Written Opinion dated Feb. 26, 2010 from the corresponding International Application No. PCT/US2009/050949 filed Jul. 17, 2009.

International Search Report and Written Opinion dated Mar. 22, 2010 from the corresponding International Application No. PCT/US2009/053853 filed Aug. 14, 2009.

International Search Report and Written Opinion dated May 14, 2010 from the corresponding International Application No. PCT/US2009/060085 filed Oct. 9, 2009.

International Search Report and Written Opinion dated May 24, 2010 from the corresponding International Application No. PCT/US2009/060087 filed Oct. 9, 2009.

International Search Report and Written Opinion dated May 24, 2010 from the corresponding International Application No. PCT/2009/060083 filed Oct. 9, 2009.

International Search Report and Written Opinion dated Jul. 16, 2009 from the corresponding International Application No. PCT/US2008/084650 filed Nov. 25, 2008.

International Search Report and Written Opinion dated Feb. 8, 2011 from the corresponding International Application No. PCT/US2010/039608 filed Jun. 23, 2010.

International Search Report and Written Opinion dated Dec. 24, 2010 from the corresponding International Application No. PCT/US2010/034635 filed May 13, 2010.

International Search Report and Written Opinion dated Feb. 7, 2011 from the corresponding International Application No. PCT/US2010/039678 filed Jun. 23, 2010.

International Search Report and Written Opinion dated Dec. 13, 2010 from the corresponding International Application No. PCT/US2010/037006 filed Jun. 2, 2010.

LCD Optics 101 Tutorial [online]. 3M Corporation, [retrieved on Jan. 6, 2010]. Retrieved from the internet: <URL: http://solutions.3m.com/wps/portal/3M/en_US/Vikuiti1/BrandProducts/secondary/optics101/>.

International Search Report and Written Opinion dated Jul. 30, 2010 from the corresponding International Application No. PCT/US2010/021448 filed on Jan. 20, 2010.

International Search Report and Written Opinion dated Aug. 16, 2010 from the corresponding International Application No. PCT/US2010/021131 filed on Jan. 15, 2010.

International Search Report and Written Opinion dated May 7, 2010 from the corresponding International Application No. PCT/US2009/057109 filed on Sep. 16, 2009.

International Search Report and Written Opinion dated Apr. 30, 2010 from the corresponding International Application No. PCT/US2009/057072 filed on Sep. 16, 2009.

International Search Report and Written Opinion dated Aug. 17, 2010 from the corresponding International Application No. PCT/US2010/021489 filed on Jan. 20, 2010.

International Search Report and Written Opinion dated Apr. 8, 2010 from the corresponding International Application No. PCT/2009/055114 filed on Aug. 27, 2009.

CIRCUIT BOARD MOUNT FOR LED LIGHT TUBE

CROSS REFERENCE TO RELATED APPLICATION

This application claims priority to U.S. Provisional Application Ser. No. 61/363,405 filed on Jul. 12, 2010 and incorporated herein by reference in its entirety.

FIELD OF THE INVENTION

The present invention relates in general to a light emitting diode (LED) based light tube, and in particular to a circuit board mount for the LED light tube and methods of mounting the circuit board.

BACKGROUND

Fluorescent tube lights are widely used in a variety of locations, such as schools and office buildings. Although conventional fluorescent bulbs have certain advantages over, for example, incandescent lights, they also pose certain disadvantages including, inter alia, disposal problems due to the presence of toxic materials within the glass tube.

LED-based tube lights which can be used as one-for-one replacements for fluorescent tube lights having appeared in recent years. LED-based lights can be constructed as a partially or completely enclosed tube with LEDs and other circuitry mounted on one or more circuit boards inside the tube. The circuit board is long and thin, having a large aspect ratio, making centering the circuit board while allowing for manufacturing tolerances and thermal expansion a challenge.

SUMMARY

Disclosed herein are embodiments of a circuit board mount for an LED-based light tube having an elongate housing with at least one circuit board spanning the housing. One embodiment disclosed herein of a circuit board mount comprises an end cap configured to fit over an open end of the housing. The end cap comprises an end wall, a side wall extending from the end wall, at least one pin connector extending through the end wall and at least one fitted slot extending from the end wall within the side wall configured to receive an end of the circuit board, the at least one fitted slot having an elastic member within the at least one fitted slot configured to cushion the circuit board.

A circuit board mount for an LED-based light tube having an elongate housing with at least one circuit board in the housing comprises an end cap configured to fit over an open end of the housing. The end cap comprises an end wall, at least one pin connector extending through the end wall and at least one fitted slot carried by the end wall configured to receive an end of the circuit board, wherein the end cap is configured to apply stress to the circuit board to keep the circuit board stationary and cushioned.

The at least one fitted slot can be formed within the end wall. The end cap can further comprise an elastic member within each of the at least one fitted slot. Each of the at least one fitted slot can have at least one beveled edge configured to guide the circuit board into the at least one fitted slot.

The end cap can further comprise a fitting in which the at least one fitted slot is formed, the fitting carried by the end wall. The fitting can be an elastic material. Each of the at least one fitted slot can have at least one beveled edge configured to guide the circuit board into the at least one fitted slot.

Each of the at least one fitted slot can be defined by at least two walls extending from an interior surface of the end wall. At least one wall of each of the at least one fitted slot can have at least one beveled edge configured to guide the circuit board into the at least one fitted slot. The end cap can further comprise an elastic member within each of the at least one fitted slot.

The at least one pin connector can be two pin connectors with one of the at least one fitted slots extending lengthwise between the two pin connectors.

Also disclosed herein are embodiments of LED-based lights for replacing a conventional fluorescent light bulb in a fluorescent light fixture. One embodiment of an LED-based light comprises an elongate housing having two open ends, a circuit board extending through the elongate housing between the two open ends, a plurality of LEDs mounted on a surface of the circuit board and two end caps. Each end cap is fitted over an open end of the housing. Each end cap has an end wall and at least one pin connector. At least one of the end caps comprises at least one fitted slot carried by the end wall and configured to receive an end of the circuit board, wherein the end cap is configured to apply stress to the circuit board to keep the circuit board stationary and cushioned.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
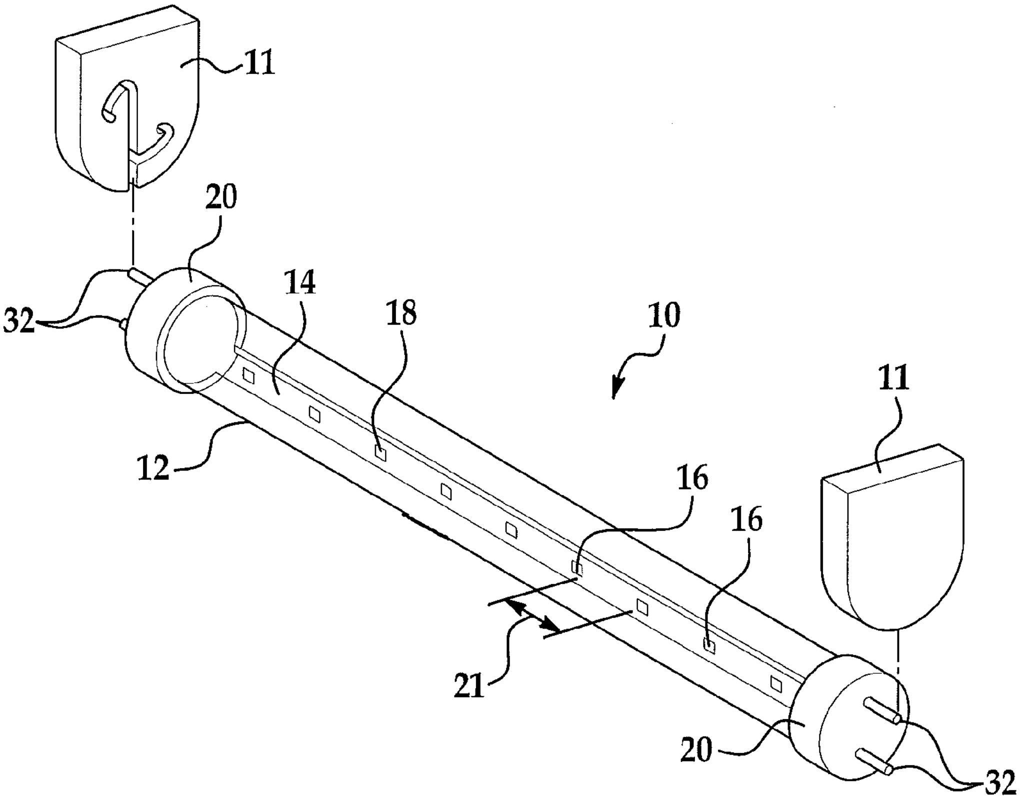
FIG. 1 is a perspective view of an embodiment of an LED-based light tube disclosed herein.

FIG. 1 illustrates an LED light tube 10 according to embodiments disclosed herein. The light tubes 10 can be used in, for example, an existing fluorescent lamp fixture 11 that may have been previously used in a light system for a fluorescent lamp. The fixture 11 can contain a ballast (not shown) which can be connected between a signal source and the lighting module 10.

The light tube 10 includes a housing 12, a circuit board 14 in the housing 12, a plurality of LEDs 18 mounted on the circuit board 14, and a pair of end caps 20 attached at opposing ends of the housing 12. The light tube 10 can additionally include other components, such as electrical components or one or more highly thermally conductive structures for enhancing heat dissipation. The lights described herein are presented as examples and are not meant to be limiting. The embodiments of the housings disclosed herein can be used with any internal light components known to those skilled in the art compatible with the scope of the disclosure.

The housing 12 in any of the embodiments disclosed herein can be made from polycarbonate, acrylic, glass or another light transmitting material (i.e., the housing 12 can be transparent or translucent). For example, a translucent housing can be made from a composite, such as polycarbonate with particles of a light refracting material interspersed in the polycarbonate. While the illustrated housing 12 is cylindrical, housing having a square, triangular, polygonal, or other cross sectional shape can alternatively be used. Additionally, the housing 12 need not be a single piece as shown. Instead, another example of a housing can be formed by attaching multiple individual parts, not all of which need be light transmitting. For example, a housing 12 for a module can be formed by attaching multiple individual parts such as an opaque lower portion and a lens or other transparent cover attached to the lower portion to cover the LEDs 18. The housing 12 can be manufactured to include light diffusing or refracting properties, such as by surface roughening or applying a diffusing film to the housing 12. The single housings typically have a length of approximately 48", with diameters of 0.625", 1.0", or 1.5" for engagement with common fluorescent fixtures.

LEDs 18 can include at least one LED, a plurality of series-connected or parallel-connected LEDs, or an LED array. At least one LED array can include a plurality of LED arrays. Any type of LED may be used in LEDs 18. For example, LEDs can be high-brightness semiconductor LEDs, an organic light emitting diodes (OLEDs), semiconductor dies that produce light in response to current, light emitting polymers, electro-luminescent strips (EL) or the like. The LEDs 18 can be surface-mount devices of a type available from Nichia. The LEDs 18 can be mounted to the circuit board 14 by solder, a snap-fit connection, or other means. The LEDs 18 can produce white light. However, LEDs that produce blue light, ultra-violet light or other wavelengths of light can be used in place of white light emitting LEDs 18. Although the embodiments will be discussed with reference to modules that solely contain LEDs, other embodiments of lighting modules do not have to be exclusively limited to LEDs. For example, other embodiments of lighting modules may contain a combination a fluorescent lamp and LEDs.

The number of LEDs 18 in a light tube 10 can be a function of the desired power of the lamp 10 and the power of the LEDs 18. For a 48" light, the number of LEDs 18 can vary from about five to four hundred such that the light tube 10 outputs approximately 500 to 3,000 lumens. However, a different number of LEDs 18 can alternatively be used, and the lamp 10 can output a different amount of lumens. The LEDs 18 can be evenly spaced along the circuit board 14, and the spacing of the LEDs 18 can be determined based on, for example, the light distribution of each LED 18 and the number of LEDs 18.

The circuit board 14 is not limited to the example shown in the figures. The circuit board 14 can have a LED-mounting side and a primary heat transferring side opposite the LED-mounting side. The circuit board 14 may have an LED-mounting side with apertures along the circuit board to allow light to pass through. The circuit board 14 may be made in one piece or in longitudinal sections joined by electrical bridge connectors. The circuit board 14 and the housing 12 can be in thermally conductive relation with the circuit board 14 attached to the housing 12 using highly thermally conductive adhesive transfer tape. The circuit board 14 is preferably one on which metalized conductor patterns can be formed in a process called "printing" to provide electrical connections from connectors on the end caps 20 to the LEDs 18 and between the LEDs 18 themselves. An insulative board is typical, but other circuit board types, e.g., metal core circuit boards, can alternatively be used.

The circuit board 14 is typically centered longitudinally within the housing 12 while allowing tolerances for circuit board and tube length variations due to manufacturing and thermal expansion. A space can be provided between the end cap 20 and the circuit board 14 to allow for such variations and expansions. The circuit board 14 may move within the space during shipping or installation or, if mishandled, producing high loads on the circuit board 14, can be disconnected between the circuit board 14 and other components. The circuit board 14 can be glued or otherwise fastened to the housing 12 along their length or at the end caps 20 to prohibit sliding, but this adds time and cost to the manufacturing process.

Figure 2:
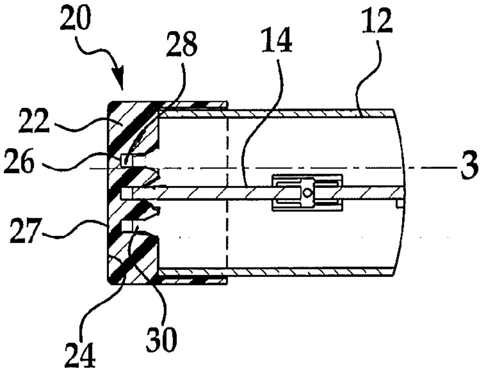
FIG. 2 is an enlarged cross sectional view of an embodiment of a circuit board mount on a portion of the LED-based light tube disclosed herein.
Figure 3:
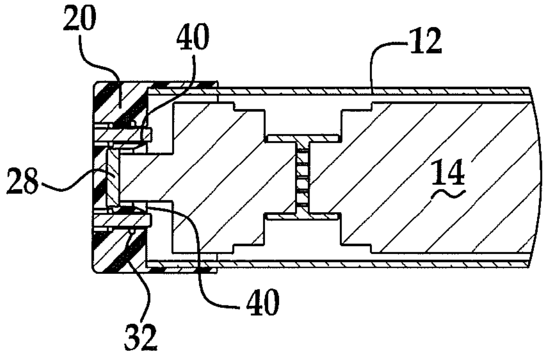
FIG. 3 is a cross sectional view across line 3 of FIG. 2.
Figure 5:
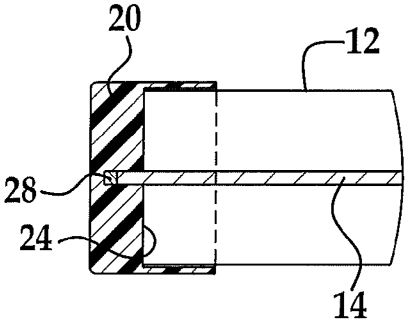
FIG. 5 is an enlarged cross sectional view of another embodiment of a circuit board mount on a portion of the LED-based light tube disclosed herein.

FIGS. 2 and 3 illustrate an embodiment of a circuit board mount for the LED light tube as disclosed herein. As shown in FIG. 1, end caps 20 are provided that fit over each end of the housing 12. FIG. 2 is an enlarged view of an end cap 20 in the first embodiment. The end cap 20 has an end wall 22 with an interior surface 24. The end cap 20 can be fastened to the housing 12 using screws or other hardware, clips, friction fit or adhesive. Extending from the interior surface 24 into the end wall 22 are three fitted slots 26 spaced along the diameter of the interior surface 24. The end wall 22 is of sufficient thickness to define the slots 26 while maintaining an exterior wall 27. Although three fitted slots 26 are illustrated, any number of slots can be used. For example, FIG. 5 illustrates an end cap 20 having a single slot 26 within which an end of a circuit board 14 is received. As shown in FIG. 2, each fitted slot 26 has an elastic member 28 within the slot. The elastic member 28 is shorter than the length of the fitted slot 26, providing a cavity 30 within which the circuit board 14 can be received. As shown in FIG. 2, the circuit board 14 can be substantially centered within the housing 12 by positioning the circuit board 14 within the center of the three fitted slots 26.

In the embodiment in FIG. 2, each end cap is configured with the fitted slots 26 having an elastic member 28. The end caps 20 can be fastened to the housing 12 in such a way as to stress the elastic members 28 in a direction parallel to the longitudinal axis of the housing 12. The prevailing force created on the circuit board 14 keeps the circuit board stationary and any connectors to or from the circuit board 14 properly mated. The elastic member 28 also provides padding against end loads that may be applied to the light tube 10.

Figure 4:
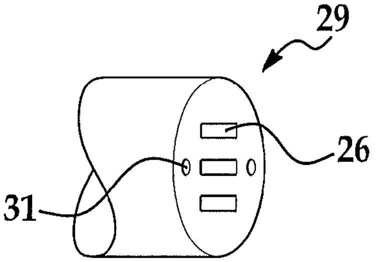
FIG. 4 is a perspective view of a fitting described herein.

Rather than having an end wall 22 of a sufficient thickness to define the slots 26, a fitting 29 can be inserted into the end cap 20 that replicates the thickened end wall 22 defining the slots 26. The fitting 29 is shown in FIG. 4. The fitting 29 can be friction fit or fastened in the end cap with adhesive, for example. The fitting can be made of elastic material so that the elastic member 28 in each slot 26 is not required. The fitting 29 itself can provide the pre-stress and the padding of the elastic members 28. The fitting 29 can be made of any suitable material. By means of illustration and not meant to be limiting, materials such as rubber, polychloroprene, and other elastic polymers can be used.

FIG. 3 is a cross sectional view of FIG. 2 along line 3. The fitted slots 26 can have beveled edges 40 as shown in FIG. 3. The beveled edges 40 assist in guiding the end of the circuit board 14 into the fitted slot 26. As shown in FIG. 3, both side edges are beveled; however, it is contemplated that none or only one side edge may be beveled. It is also contemplated that three or all four of the edges of the slot be beveled. The slots 26 in the fitting 29 can also have beveled edges as described.

Illustrated in FIG. 3 are the pins 32 of the end cap 20. The fitted slots 26 are shown positioned length-wise between the pins 32 for illustration. It is contemplated that the fitted slots 26 can be positioned in a different relation to the pins 32. Two pins 32 are shown by means of illustration and are not meant to be limiting. One of the two pins 32 can be a "dummy pin" that does not provide an electrical connection. Alternatively, instead of pairs of pins 32 as shown, other types of electrical connectors depending on the type of fixture 11 can extend from the end cap 20 into the housing 12. For example, a single pin can be used instead of two pins 32 for compatibility with a single pin fixture. Alternatively, both pins 32 can be "dummy pins" that do not provide an electrical connection, thereby requiring the use of such module with another end module that provides the electrical connection with the fixture 11. The fitting 29 would also have through holes 31 to provide for the pins 32.

Figure 6:
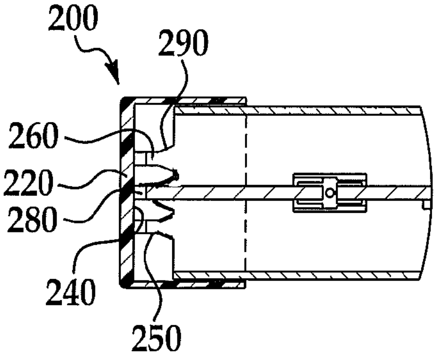
FIG. 6 is an enlarged cross sectional view of another embodiment of a circuit board mount on a portion of the LED-based light tube disclosed herein.

FIG. 6 is another embodiment of the end cap 200. In this embodiment, the end cap 200 has an end wall 220 with an interior surface 240. Extending from the interior surface 240 are walls 250 that define slots 260. As shown in FIG. 6, there are six walls 250 defining three slots 260. Although three slots 260 are illustrated, any number of slots can be formed. Each slot 260 can be formed from two walls 250 with sides left open, or the sides of the slots 260 can be closed off with additional walls perpendicular to those shown. The slots 260 are fitted with elastic members 280 as described above. The edges 290 of the walls 250 can be beveled as described above.

Figure 7:
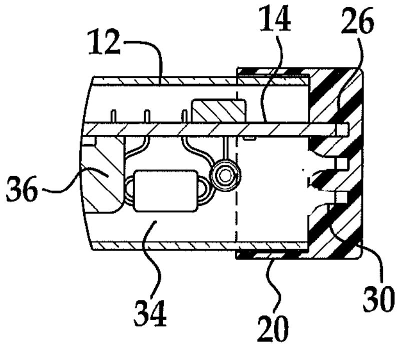
FIG. 7 is an enlarged cross sectional view of another embodiment of a circuit board mount on a portion of the LED-based light tube disclosed herein.

FIG. 7 illustrates the use of a fitted slot 26 other than the center slot. The circuit board 14 in FIG. 5 is received within an outer fitted slot 26, providing a larger space 34 within the housing 12 for power converters 36 and other circuitry. Power converter 36 can convert the power received through the fixture into power usable by and suitable for the LEDs 18. Power converter 36 can include one or more of an inrush protection circuit, a surge suppressor circuit, a noise filter circuit, a rectifier circuit, a main filter circuit, a current regulator circuit and a shunt voltage regulator circuit. Current regulator circuit can be connected to LEDs 18. The power converter 36 can be suitably designed to receive a wide range of currents and/or voltages from a power source.

A light tube 10 can be configured with an end cap 20 having one or more fitted slots 26 with elastic members 28 on both ends of the housing 12. The circuit board 14 would be held securely between the elastic members 28 of the fitted slot 26 while having a degree of padding at each end. It is also contemplated that a light tube 10 will have an end cap 20 having one or more fitted slots 26 with elastic members 28 on one end of the housing 12, while the other end of the housing 12 uses a conventional end cap. The conventional end cap can provide a hard stop against which the circuit board 14 would rest. The end cap 20 with the fitted slot 26 and elastic member 28 can provide the padding and the flexibility to withstand thermal expansion.

The elastic member 28 can be made of any suitable material. By means of illustration and not meant to be limiting, materials such as rubber, polychloroprene, and other elastic polymers can be used.

While the invention has been described in connection with certain embodiments, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A circuit board mount for an LED-based light tube having an elongate housing with at least one circuit board in the housing, the circuit board mount comprising:
- an end cap configured to fit over an open end of the housing, the end cap comprising:
  - an end wall;
  - at least one pin connector extending through the end wall; and
  - at least one fitted slot carried by and formed within the end wall configured to receive an end of the circuit board, wherein the end cap is configured to apply stress to the circuit board to keep the circuit board stationary and cushioned and
- wherein the end cap further comprises an elastic member within each of the at least one fitted slot.

2. The circuit board mount of claim 1, wherein each of the at least one fitted slot has at least one beveled edge configured to guide the circuit board into the at least one fitted slot.

3. A circuit board mount for an LED-based light tube having an elongate housing with at least one circuit board in the housing, the circuit board mount comprising:
- an end cap configured to fit over an open end of the housing, the end cap comprising:
  - an end wall;
  - at least one pin connector extending through the end wall; and
  - at least one fitted slot carried by the end wall configured to receive an end of the circuit board, wherein the end cap is configured to apply stress to the circuit board to keep the circuit board stationary and cushioned and
- wherein the end cap further comprises a fitting in which the at least one fitted slot is formed, the fitting carried by the end wall.

4. The circuit board mount of claim 3, wherein the end cap further comprises an elastic member within each of the at least one fitted slot.

5. The circuit board mount of claim 3, wherein the at least one pin connector is two pin connectors with one of the at least one fitted slots extending lengthwise between the two pin connectors.

6. The circuit board mount of claim 3, wherein the fitting is an elastic material.

7. The circuit board mount of claim 3, wherein each of the at least one fitted slot has at least one beveled edge configured to guide the circuit board into the at least one fitted slot.

8. The circuit board mount of claim 3, wherein each of the at least one fitted slot is defined by at least two walls extending from an interior surface of the end wall.

9. The circuit board mount of claim 8, wherein at least one wall of each of the at least one fitted slot has at least one beveled edge configured to guide the circuit board into the at least one fitted slot.

10. The circuit board mount of claim 8, wherein the end cap further comprises an elastic member within each of the at least one fitted slot.

11. An LED-based light for replacing a conventional fluorescent light bulb in a fluorescent light fixture, the LED-based light comprising:
- an elongate housing having two open ends;
- a circuit board extending through the elongate housing between the two open ends;
- a plurality of LEDs mounted on a surface of the circuit board; and two end caps, each end cap fitted over an open end of the housing, each end cap having an end wall and at least one pin connector, wherein at least one of the end caps comprises:

at least one fitted slot carried by and formed within the end wall and configured to receive an end of the circuit board, wherein the end cap is configured to apply stress to the circuit board to keep the circuit board stationary and cushioned, wherein each of the at least one fitted slot has an elastic member against which the circuit board is received.

12. The LED-based light of claim 11, wherein each of the at least one fitted slot is defined by at least two walls extending from an interior surface of the end wall.

13. The LED-based light of claim 12, wherein each of the at least one fitted slot has at least one beveled edge configured to guide the circuit board into the at least one fitted slot.

14. The LED-based light of claim 11, wherein the at least one pin connector is two pin connectors with one of the at least one fitted slots extending lengthwise between the two pin connectors.

15. The LED-based light of claim 11, wherein each of the at least one fitted slot has at least one beveled edge configured to guide the circuit board into the at least one fitted slot.

16. The LED-based light of claim 11, wherein the end cap further comprises a fitting in which the at least one fitted slot is formed, the fitting carried by the end wall.

17. The LED-based light of claim 16, wherein the fitting is an elastic material.

* * * * *